(12) United States Patent
Wiener et al.

(10) Patent No.: US 7,894,140 B2
(45) Date of Patent: Feb. 22, 2011

(54) COMPENSATION TECHNIQUES FOR FLUID AND MAGNETIC BEARINGS

(75) Inventors: Roberto B. Wiener, Ridgefield, CT (US); Santiago E. Del Puerto, Milton, NY (US)

(73) Assignee: ASML Holding N.V., Veldhoven (NL)

( * ) Notice: Subject to any disclaimer, the term of this patent is extended or adjusted under 35 U.S.C. 154(b) by 563 days.

(21) Appl. No.: 11/940,165

(22) Filed: Nov. 14, 2007

(65) Prior Publication Data

US 2008/0151386 A1 Jun. 26, 2008

Related U.S. Application Data

(63) Continuation-in-part of application No. 11/598,836, filed on Nov. 14, 2006, now abandoned.

(51) Int. Cl.
G02B 15/14 (2006.01)
(52) U.S. Cl. .................................. 359/694; 359/695
(58) Field of Classification Search ............... 359/694
See application file for complete search history.

(56) References Cited

U.S. PATENT DOCUMENTS

| 4,630,942 A | 12/1986 | Tsumaki et al. |
| 4,952,858 A | 8/1990 | Galburt |
| 4,974,970 A * | 12/1990 | Sugita et al. ............... 384/12 |
| 5,001,842 A | 3/1991 | Wright et al. |
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |

(Continued)

FOREIGN PATENT DOCUMENTS

JP 60-150950 A 8/1985

(Continued)

OTHER PUBLICATIONS del Puerto et al., "Compensation Techniques for Fluid and Magnetic Bearings", U.S. Appl. No. 11/598,836 filed Nov. 14, 2006.

(Continued)

*Primary Examiner*—Jordan M. Schwartz
*Assistant Examiner*—James C Jones
(74) *Attorney, Agent, or Firm*—Sterne, Kessler, Goldstein & Fox P.L.L.C

(57) ABSTRACT

A system is configured to compensate for guide flatness errors and/or shifting of a support. The system can include one or more support devices, fluid or magnetic bearings to guide the one or more support devices along a guide, and a compensation system. The compensation system is coupled to respective ones of the one or more support devices adjacent to each of the fluid or magnetic bearings. The compensation system is configured to generate a rotational motion that compensates for tilting in the support devices compensate for any non-straight areas of the guide or shifting (e.g., thermal shifting) of the support devices, which is done through moving of the support devices with respect to the guides during movement of the support devices along the guide.

30 Claims, 22 Drawing Sheets

U.S. PATENT DOCUMENTS

| | | |
|---|---|---|
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2004/0041104 A1 | 3/2004 | Liebregts et al. |
| 2004/0130561 A1 | 7/2004 | Jain |
| 2005/0007572 A1 | 1/2005 | George et al. |
| 2008/0111977 A1 | 5/2008 | del Puerto et al. |

FOREIGN PATENT DOCUMENTS

| | | |
|---|---|---|
| JP | 61-218827 A | 9/1986 |
| JP | 2-035709 A | 2/1990 |
| JP | 2-247519 A | 10/1990 |
| JP | 2-266209 A | 10/1990 |
| JP | 3-142914 A | 6/1991 |
| JP | 2001-035772 A | 2/2001 |
| JP | 2002-120120 A | 4/2002 |
| JP | 2004-060833 A | 2/2004 |
| WO | WO 98/33096 A1 | 7/1998 |
| WO | WO 98/38597 A2 | 9/1998 |
| WO | WO 98/38597 A3 | 9/1998 |

OTHER PUBLICATIONS

Notification of Reasons for Refusal for Patent Application No. 2007-294735 mailed Jun. 9, 2009, 6 pgs.

* cited by examiner

COMPENSATION TECHNIQUES FOR FLUID AND MAGNETIC BEARINGS

CROSS-REFERENCE TO RELATED APPLICATION

This application is a continuation-in-part of U.S. application Ser. No. 11/598,836, filed on Nov. 14, 2006, the disclosure of which is incorporated herein by reference in its entirety.

BACKGROUND

1. Field of the Invention

The present invention relates to an optical system.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Currently, with stages that require a long range of travel in one degree of freedom de-centering effects due to the guiding and driving mechanisms are either ignored, included in the budget, or compensated by using additional actuators. In some cases, when the guide mechanism allows it, as is in the case of magnetic bearings, an external reference, such as an interferometer can be used to measure, and compensate for, intrinsic de-centering effects in the guide and drive mechanisms.

De-centering in two or more degrees of freedom can be caused by material deformation due to thermal effects, stress, or caused by manufacturing tolerances limited by current technology and price. Other sources of de-centering effects can be due to the nature of the drive and/or the guide mechanism technology. For example, when using roller bearings and leadscrews as the drive mechanisms, some motion in axes perpendicular to the direction of travel can cause de-centering. Still other causes of de-centering can be deformation of the guide mechanism due to manufacturing, stress, thermal effects, de-centering forces in the drive mechanism, and vibration, One optical design for an optical maskless lithography (OML) illuminator uses multiple optical elements that have a travel range, in one axis, of up to about 700 mm with de-centering sensitivities below about ±200 nm in the directions perpendicular to the axis of travel. An interferometer, or similar device, can be used in these systems to measure the actual de-centering of the lens and compensate for the optical effects using an additional set of optics. However, these tolerances have to be maintained for days, if not weeks, in between calibrations. Also, given the sensitivity of the optical elements to temperature changes, it is desirable to keep most, if not all, heat generating components, such as motors, away from the optical path. In addition, some optical elements may need to maintain alignment with the optical path in the directions perpendicular to travel in the sub micron range.

Therefore, what is needed is a system and method that compensates for de-centering of optical elements in an optical system.

SUMMARY

In one embodiment of the present invention, there is provided a system comprising one or more support devices, an actuating system, a guide, a fluid or magnetic bearing, and a compensation system. The one or more support devices have one or more openings. The support devices are coupled to the actuating system, which is configured to move the support devices. The guide passes through respective ones of the openings. The fluid or magnetic bearings are configured to guide the respective support devices along the guides. The compensation system is coupled to respective ones of the support devices adjacent the fluid or magnetic bearings. The compensation system is configured to compensate for any non-straight surfaces of the guides or shifting (e.g., thermal shifting) of the support devices, which is done through moving of the support devices with respect to (e.g., traverse to) the guides during movement of the support devices along the guides. Additionally, or alternatively, the compensation system is configured to generate a rotational motion that compensates for any tilting of the support devices during movement of the support devices along the guide.

In one example, the above system is part of an illumination system, for example in a lithography system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
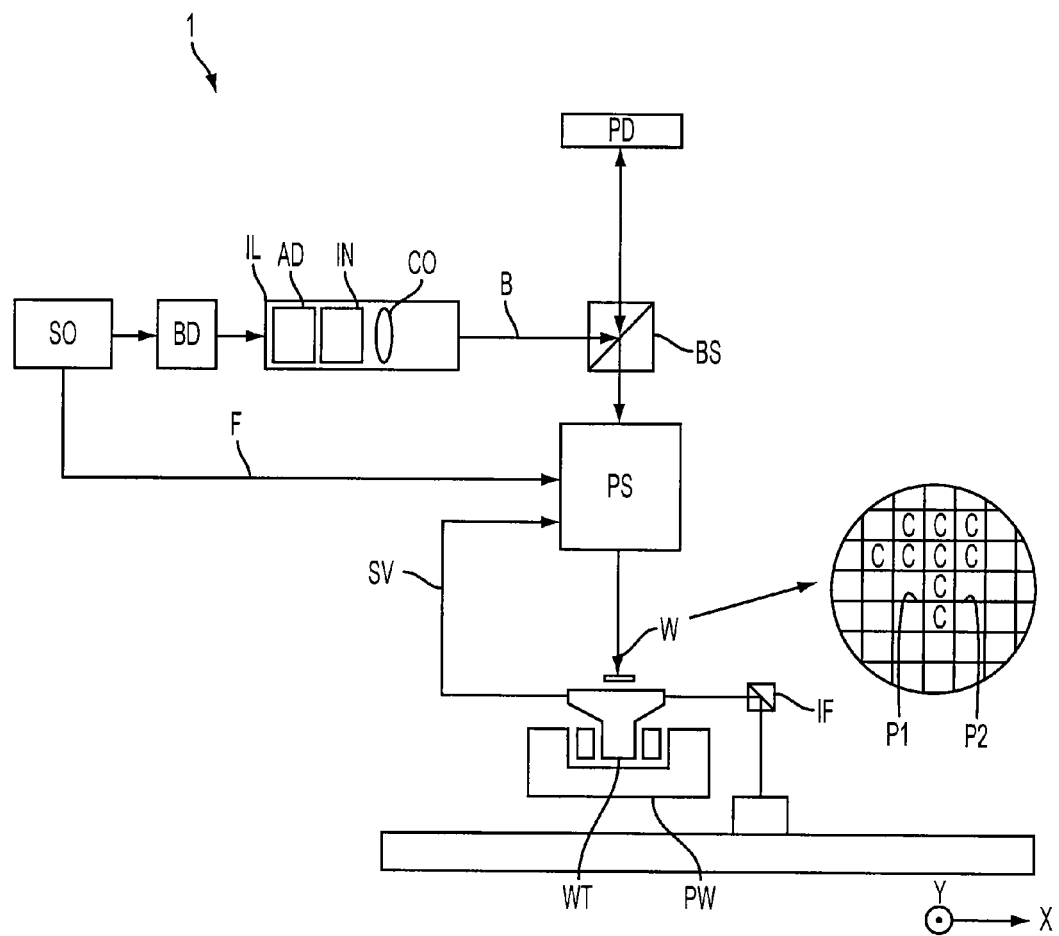
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam 1B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system PS may include dynamic elements, such as a synchronous scanning mirror SSM as described below. The synchronous scanning mirror SSM can require a frequency signal F from the radiation source SO and scan velocity signal SV from the substrate table WT to function, i.e., to control a resonant frequency of the synchronous scanning mirror SSM.

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, in P, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate may be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA may be movable (e.g., with the use of one or more actuators) at least in the direction to and away from the substrate. Being able to move the MLA to and away from the substrate allows, e.g., for focus adjustment without having to move the substrate.

Figure 2:
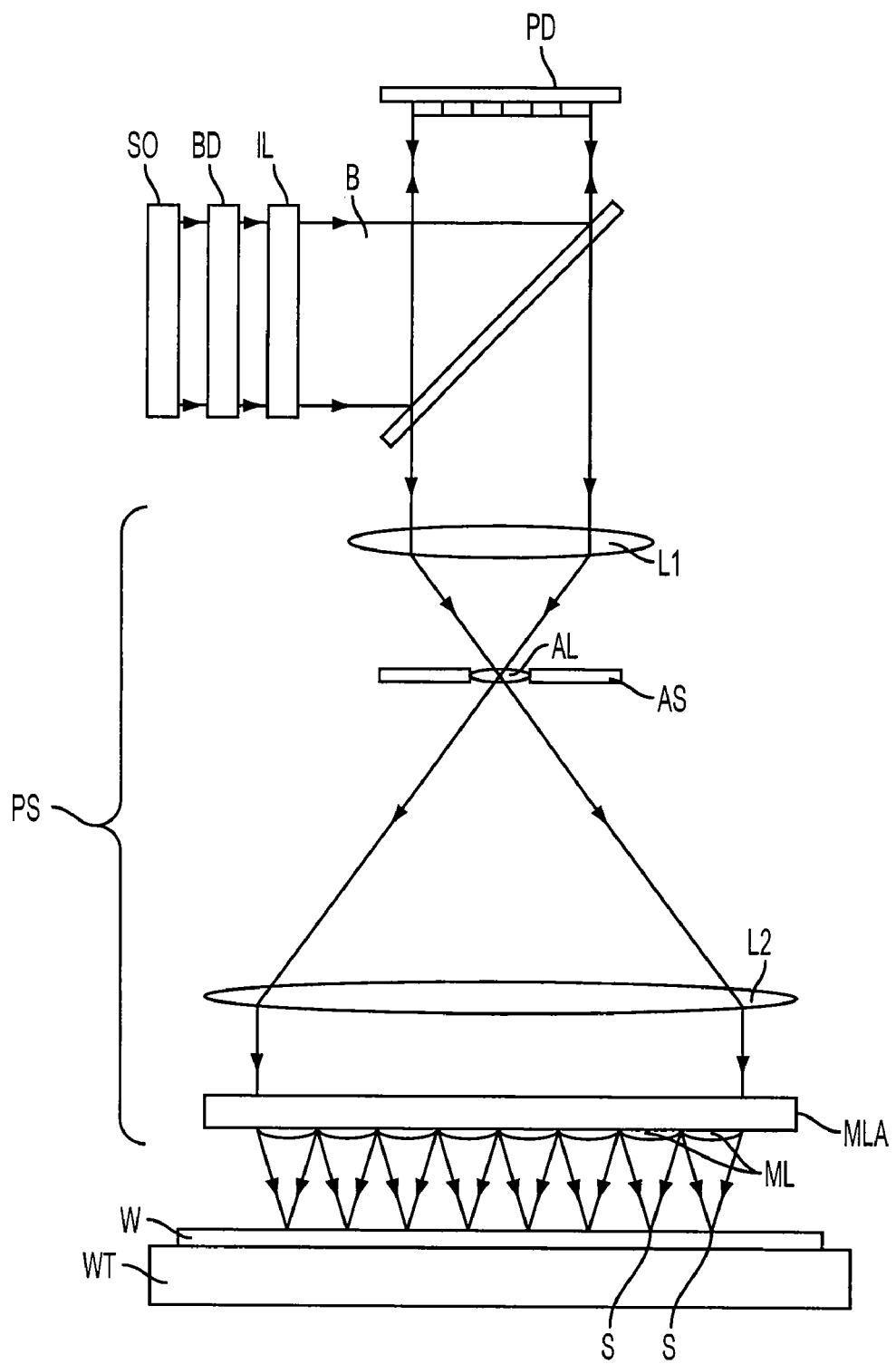

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation may have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
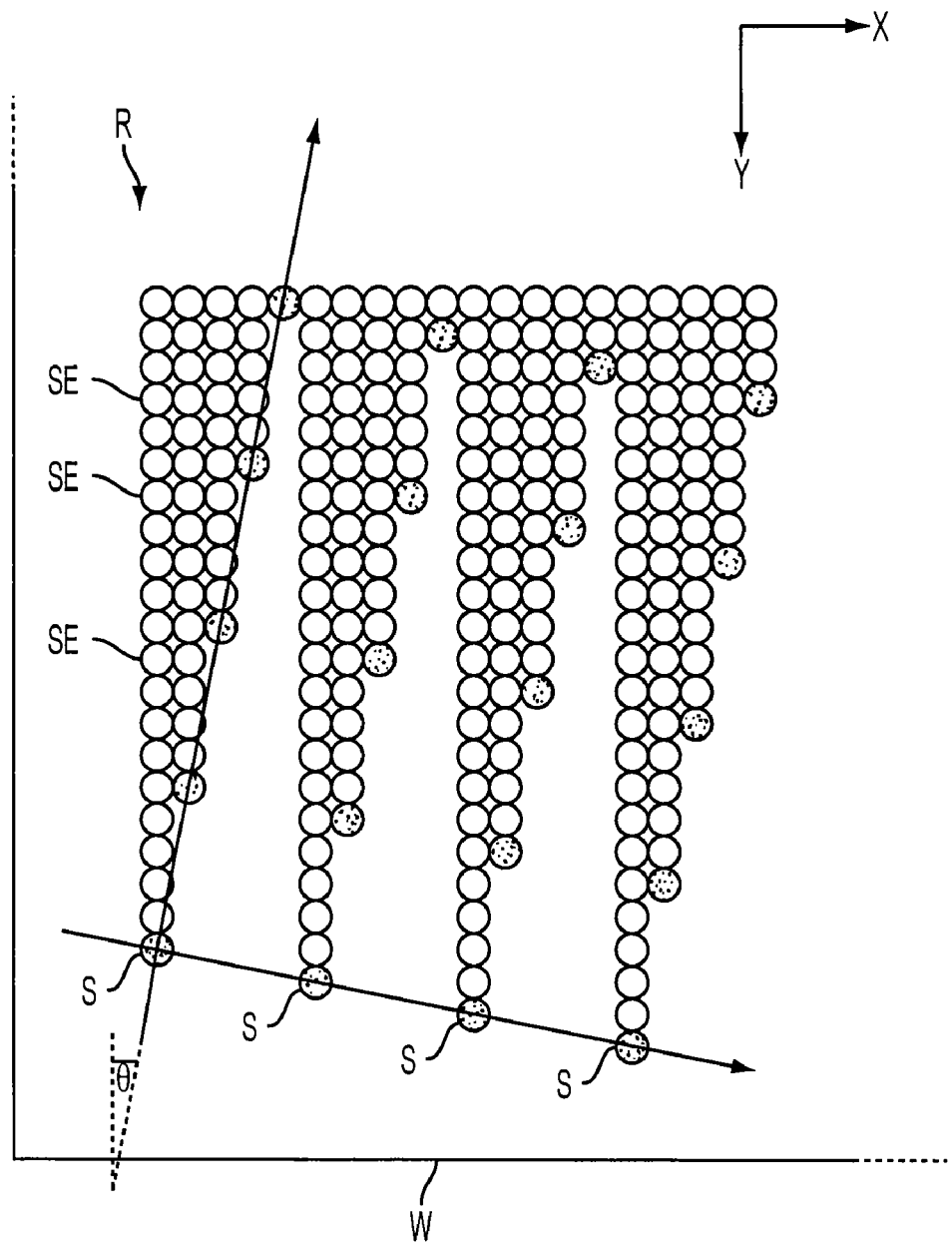
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Figure 4:
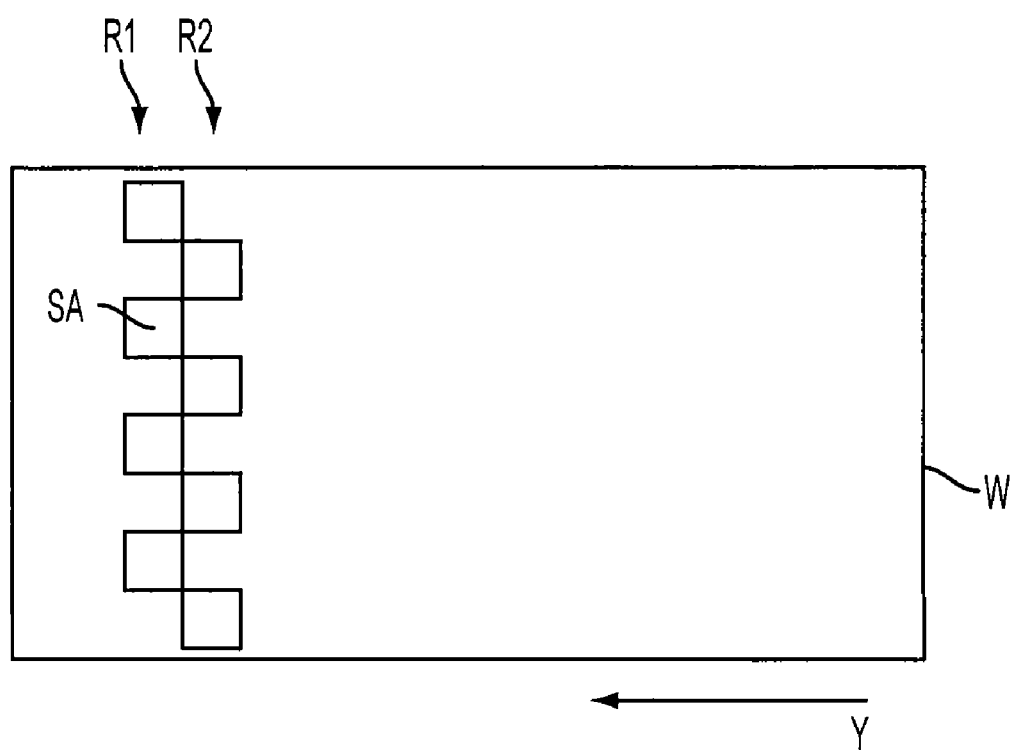
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Optical Systems

Figure 5:
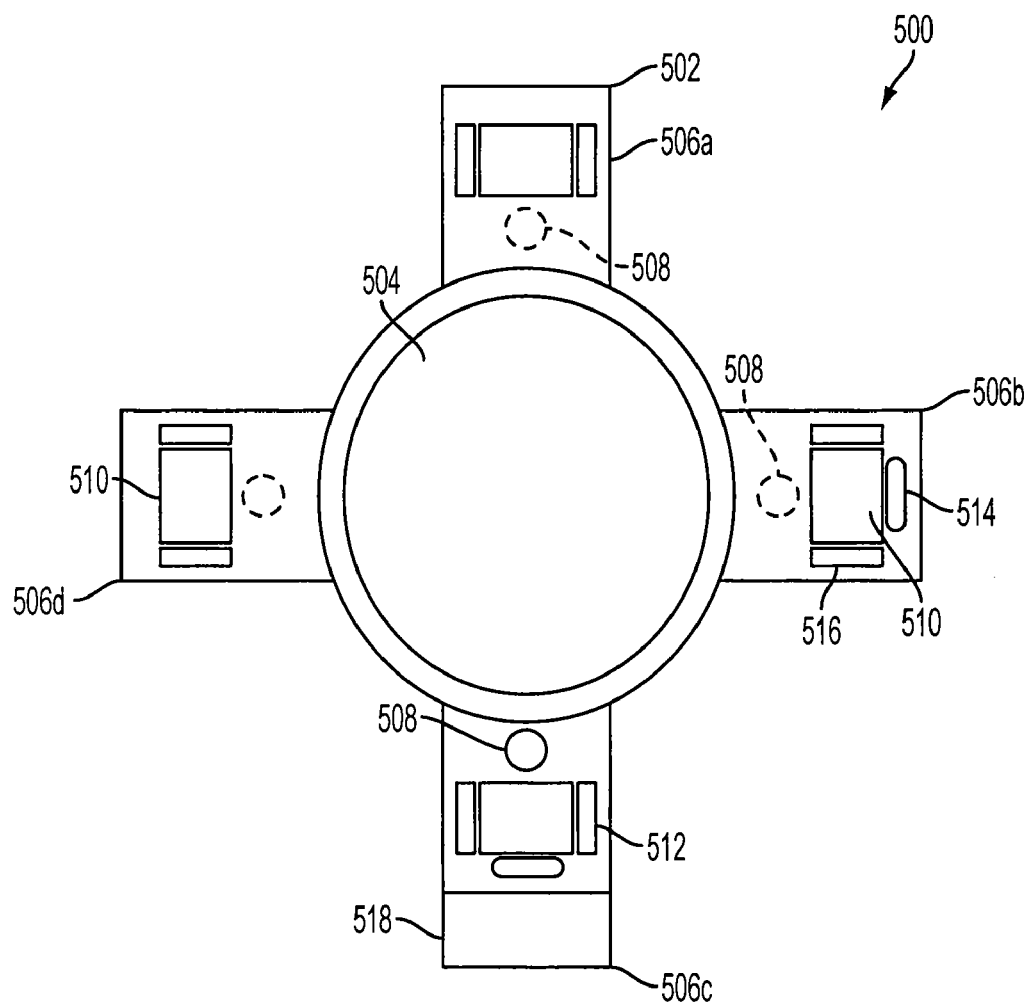
FIG. 5 shows a system.

FIG. 5 shows a system 500. For example, system 500 may be an illuminator IL and/or projection system PS in FIG. 1. System 500 includes a support device 502 that supports an object 504 (e.g., an optical element). Support device 502, in the example shown, has first through fourth alms 506a to 506d. It is to be appreciated that more or less arms 506 can be used in other applications. Each arm 506 includes openings 508 and 510 and, in one example, a compensation system 512. The one or more of arms 506 can also include a counter balance 518. For example, counter balance 518 can be used to move the center of gravity of support device 502 in order to avoid torques in an actuating system (see, e.g., element(s) 620 and 728 in FIG. 7). Openings 508 can receive, for example, a portion of the actuating system (e.g., a screw 620 in FIG. 6) that moves the support device 502. Openings 510 receive a guide (see, e.g., element 726 in FIG. 7) that is associated with a fluid or air bearing system. Compensation system 512 includes a sensor 514 and compensation device 516.

In one example, compensation system 512 can include a housing to keep it separate from the rest of the components. The compensation system 512 can be used to compensate for various unwanted motions, variations in the flatness of a surface of the guide, and thermal shifting or distortion of the support 502 and/or object 504 caused by temperature fluctuations.

Figure 6C:
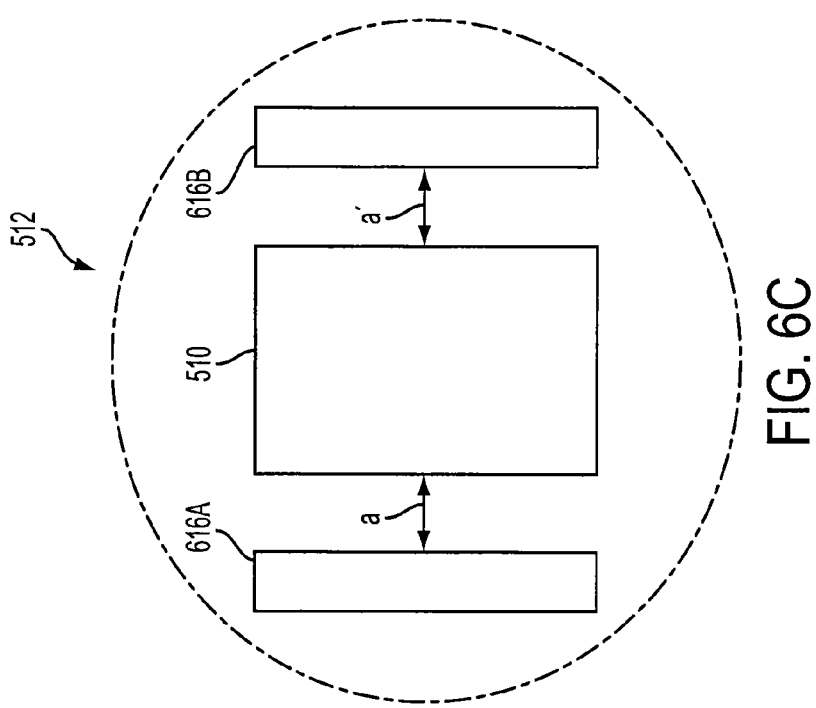
FIG. 6 shows zoomed in views of areas A and B of one arm of the system in FIG. 5.
Figure 6A:
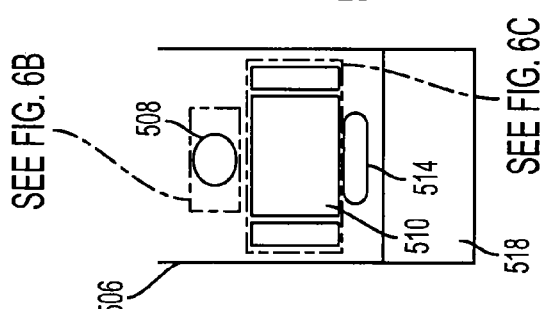
Figure 6B:
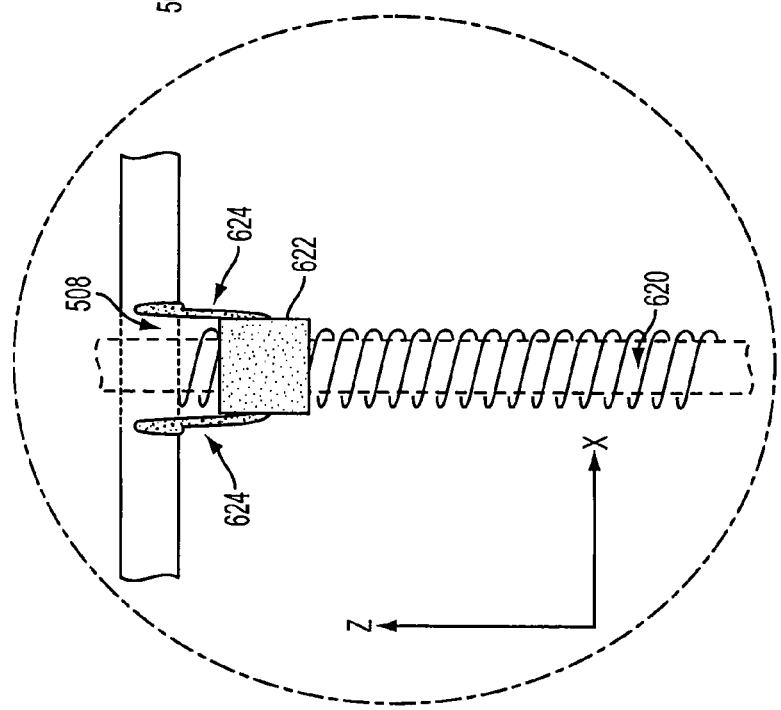

FIG. 6 shows zoomed in views of areas A and B of one arm 506 of the system 500 in FIG. 5. Zoomed area A in FIG. 6 shows an interaction between a screw 620, a nut 622, and flexures 624 with opening 508. Zoomed area B shows details of compensation system 512 that includes opening 510 (through which the guide passes) and compensation devices 616A and 616B. For example, each compensation device 616A and 616B receives a fluid or air flow from a fluid or air source (not shown) at an inlet. Then, each compensation device 616A and 616B outputs the fluid or air flow through a porous surface, or a plurality of holes in a surface that faces opening 510 (through which the guide passes) to apply a pressure to element 726 in FIG. 7, as described below. Between respective compensation devices 616A and 616B and opening 510 is an air gap a or a', respectively. In one example, a+a' remains constant. Thus, as a increases in size, a' decreases in size.

Figure 7:
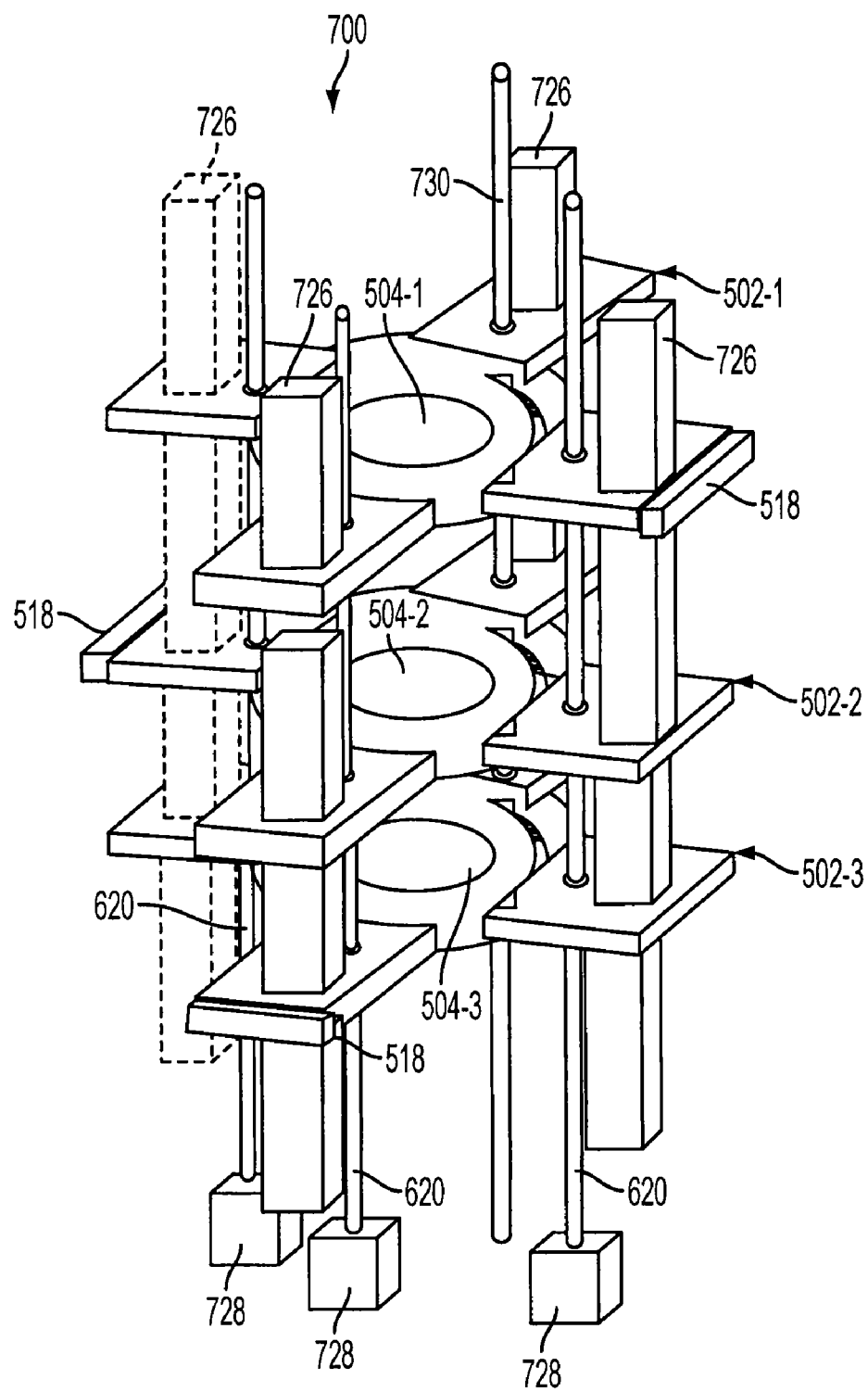
FIG. 7 shows a system including a multiple layer arrangement.

FIG. 7 shows a system 700 with a multiple layer arrangement. For example, each layer can comprise a system 500 in FIG. 5. In this example, three supports 502-1 to 502-3 are stacked and a motor 728 drives a screw 620 connected to one, or more, of the supports 502-1 to 502-3. Screw 620 can be connected to a bearing (not shown) on the free side of the assembly in order to prevent screw 620 from bending. As discussed above, a counterweight 518 can be used to offset the center of gravity of each support 502-1 to 502-3 in order to avoid tilts. Guides 726, a datum 730, and de-centering position sensors (see element 514 in FIGS. 5 and 6) can be mounted using strain relief flexures. Datum 730 is used as a reference surface to determine a position of object 504. Datum 730 can be a flat sided bar (e.g., square or rectangular) made from steel, or the like. At least one side of datum 730 is polished to a level that it is usable for measuring. Alternatively, one side of datum 730 can include a Zerodur surface to be used for the measuring. Datum 730 should be decoupled from any physical or bearing loads.

In one example, compensation system 516 is configured to compensate for any non-straight surfaces of the guides 726 or shifting (e.g., thermal shifting) of the support devices 502. This is done through moving of the support devices 502 with respect to (e.g., traverse to) the guides 726 during movement of the support devices 502 along the guides 726.

As seen in FIGS. 5-7, in one example, keeping optical element 504 centered is achieved by changing of one or both of the air gaps a and a'. For example, air gaps a and a' can be on the order of about five to ten microns. In operation, air gaps a and a' are adjusted based on the measuring of the position of datum 730 and air pressure output from respective compensation devices 616A and 616B is individually and/or independently adjusted in order to maintain alignment of optical elements 504. In this example, optical elements 504 are centered by changing a size of the gaps a and a' between compensation devices 616A and 616B and guide 726. As discussed above, one or more supports 502 are connected to driving screw 620 using a set of flexures 624 that are stiff in the direction of travel. In order to avoid tilts, counterweight 518 is used to move the center of gravity of support 502 towards the location of screw 620.

In one example, guides 726 can be made from Zerodur®, or another material that exhibits substantially no thermal expansion, and can be about 1 meter long or longer. The guides 726 can be attached to the supporting structure 502 using moment-relief flexures (not shown) to avoid stresses that could cause bending. Additionally, or alternatively, one surface of each guide 726 could be very precisely manufactured to achieve a flatness of about 100 nm or less.

In one example, system 700 in FIG. 7 can be a zoom system arrangement including two or more optical elements or lenses 504 that allows for ultra-accurate magnification control with precise centering of lenses 504. This can be used when very little de-centering tolerance, e.g., less than a few microns precision, is required, for example in lithography magnification systems. Normally, to achieve this, at least one highly machined surface of guides 726 is needed, as described above and below. However, this level or machining is not always achievable. For example, using the above range of about 5 to 10 microns for the air gaps a and a', if guides 726 have surface fluctuations of one to two microns, de-centering of lenses 504 can occur. Thus, according to embodiments and examples of the present invention, compensation system 512 is used to ensure guides 726 move supports 502 as straight or linearly as possible regardless of the quality of the surface of guides 726 to avoid any de-centering of optical elements 504 during the movement.

Cap gauges can be used for sensors 514 to measure the gaps a and a'. A face of guide 726 can be plated to be used as ground for the cap gauges 514. Based on the distance read by the cap gauges 514, the pressure or fluid flow output from compensation devices 616A and 616B is changed in order to modify the gaps a and a', which maintains proper centering of the optical element 504. In various examples, the location and number of the cap gauges 514 can be modified in order to measure and correct for tilts.

In another example, a 2-D position encoder can be used for sensor 514. A first in-plane signal from 2-D position encoder 514 interacting with a grid (not shown) etched on guide 726 can be fed back to compensation system 512. A first-in plane signal is used to measure displacement along an axis perpendicular to the direction of travel of support 502 and a second in-plane signal from 2-D encoder 514 is used to measure displacement along the direction of travel of support 502. The first and second signals are fed back to compensation system 512. A direction of de-centering will dictate a direction of gratings used on guides 726 as a reference for encoder 514.

Additionally, or alternatively, sensor 514 can be, but is not limited to, an interferometer, an image sensor, or some other light based sensing system known in the art to perform the measuring.

Alternatively, or additionally, a pneumatic loop can also be used to compensate for relatively low frequency vibrations.

Even though originally intended for air or fluid bearings, this invention would also be applicable to supports 502 using any type of fluid bearing where the fluid gap can be varied. It would be apparent to one skilled in the art that a support 502 levitated by magnetic bearings instead of air bearings could also be used without departing from the scope of this invention, as long as the gap in the magnetic bearings is variable.

Fluid or magnetic bearings can add not only up to 4 degrees of freedom (2 displacements and 2 rotations), but also provide additional damping while providing a stiff support. This desired stiff support can occur up to around 100 Hz. In addition, using air bearings can minimize any additional heat dissipation due to the additional degrees of freedom.

Figure 8:
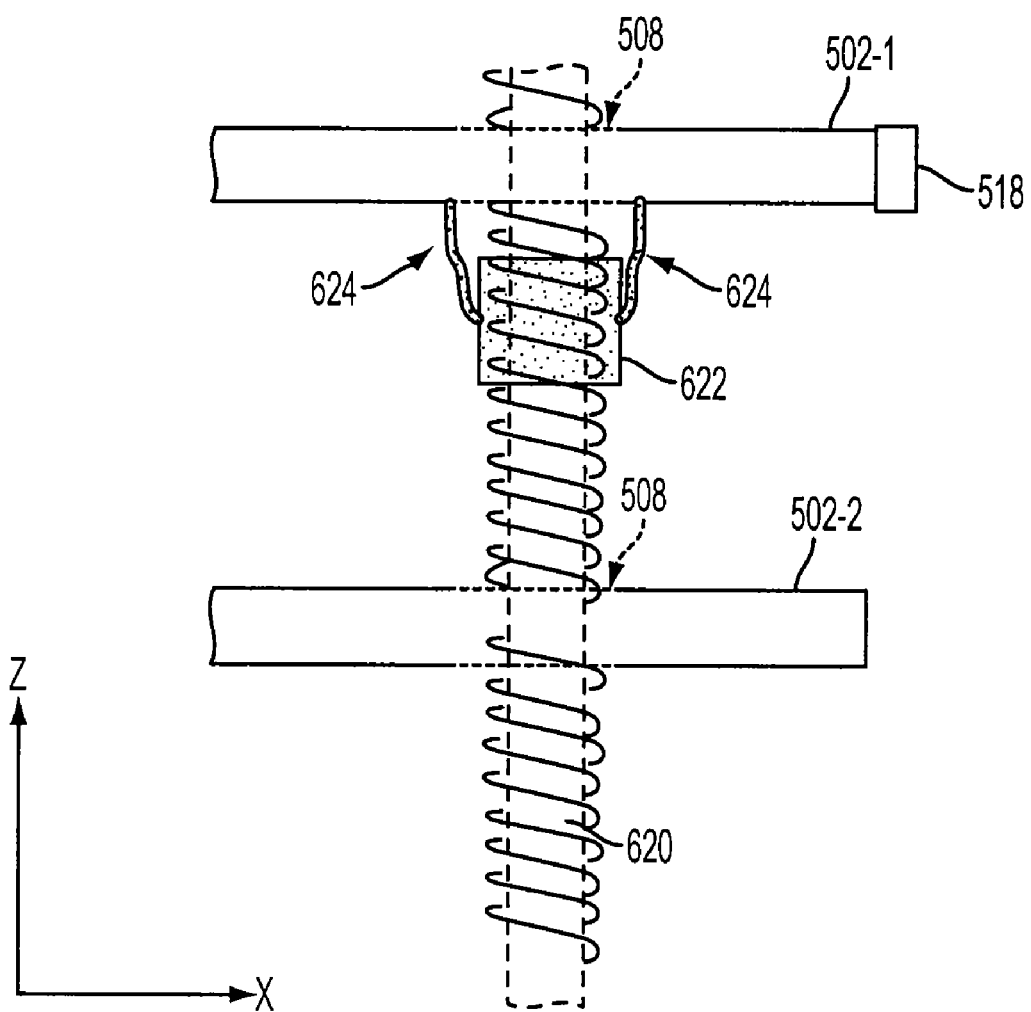
FIG. 8 shows a portion of the system of FIG. 7 illustrating a screw based actuating system.

FIG. 8 shows a portion of the system of FIG. 7 illustrating screw 620 with a multiple layer arrangement. Its operation will remain similar to as described with respect to FIGS. 6 and 7. For example, a motor (not shown, see, e.g., FIG. 7, element 728) is used to drive screw 620 that is connected through nut 622 to the one of the supports, e.g., support 502-1. Screw 620 passes through a set of holes 508 in supports 502 it does not control.

Figure 9:
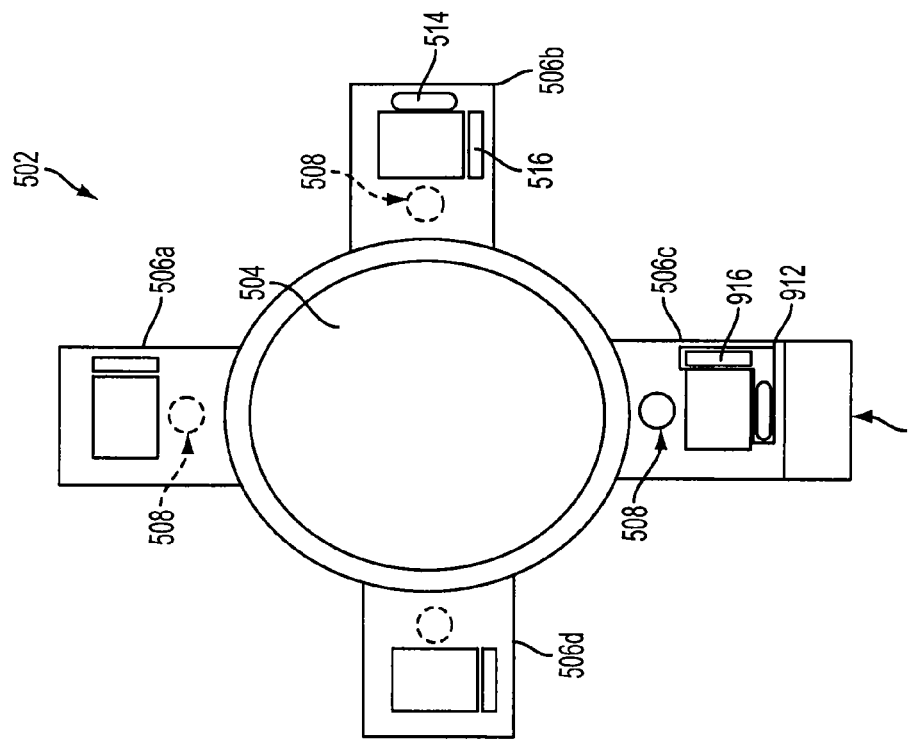
FIG. 9 shows an alternative arrangement for a compensation system.

FIG. 9 shows an alternative arrangement for a compensation system 912. As compared to compensation system 512 shown in FIGS. 5 and 6, compensation system 912 includes a single compensation device 916 instead of two compensation devices 616A and 616B. This single compensation device 916 has both a push and pull functionality to alter positioning of support 502 and/or object 504. For example, compensation device 916 can have a fluid flow or pressure exerting output operation to push support 502 and a vacuum operation to pull support 502. Otherwise, compensation system 512 functions similarly to the operation described above to adjust a or a'.

Figure 10:
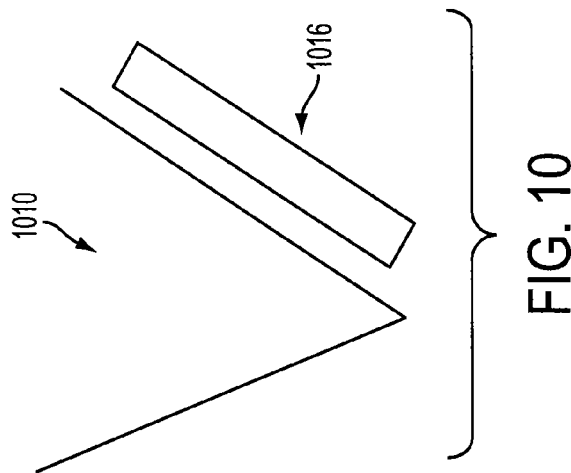
FIG. 10 shows an arrangement of a compensation device with respect to an opening in a support device that receives a guide.
Figure 11:
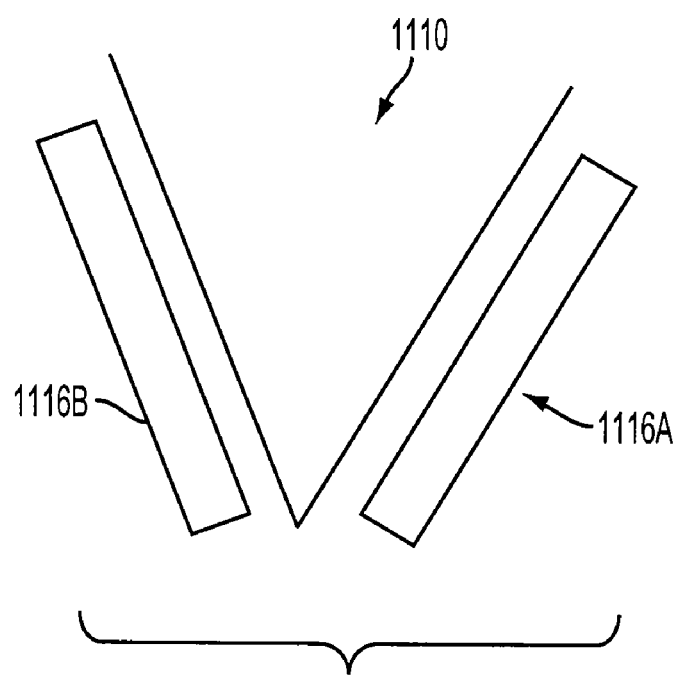
FIG. 11 shows another arrangement of compensation devices with respect to an opening in a support device that receives a guide.

FIG. 10 shows an arrangement of compensation device 1016 with respect to an opening 1010 for a guide (not shown). Similarly, FIG. 11 shows another arrangement of compensation devices 1116A and 1116B with respect to opening 1110 for a guide (not shown). In both these arrangements, the guide is triangular/"V" shaped, and not square/rectangular shaped as shown in FIG. 5.

Figure 12:
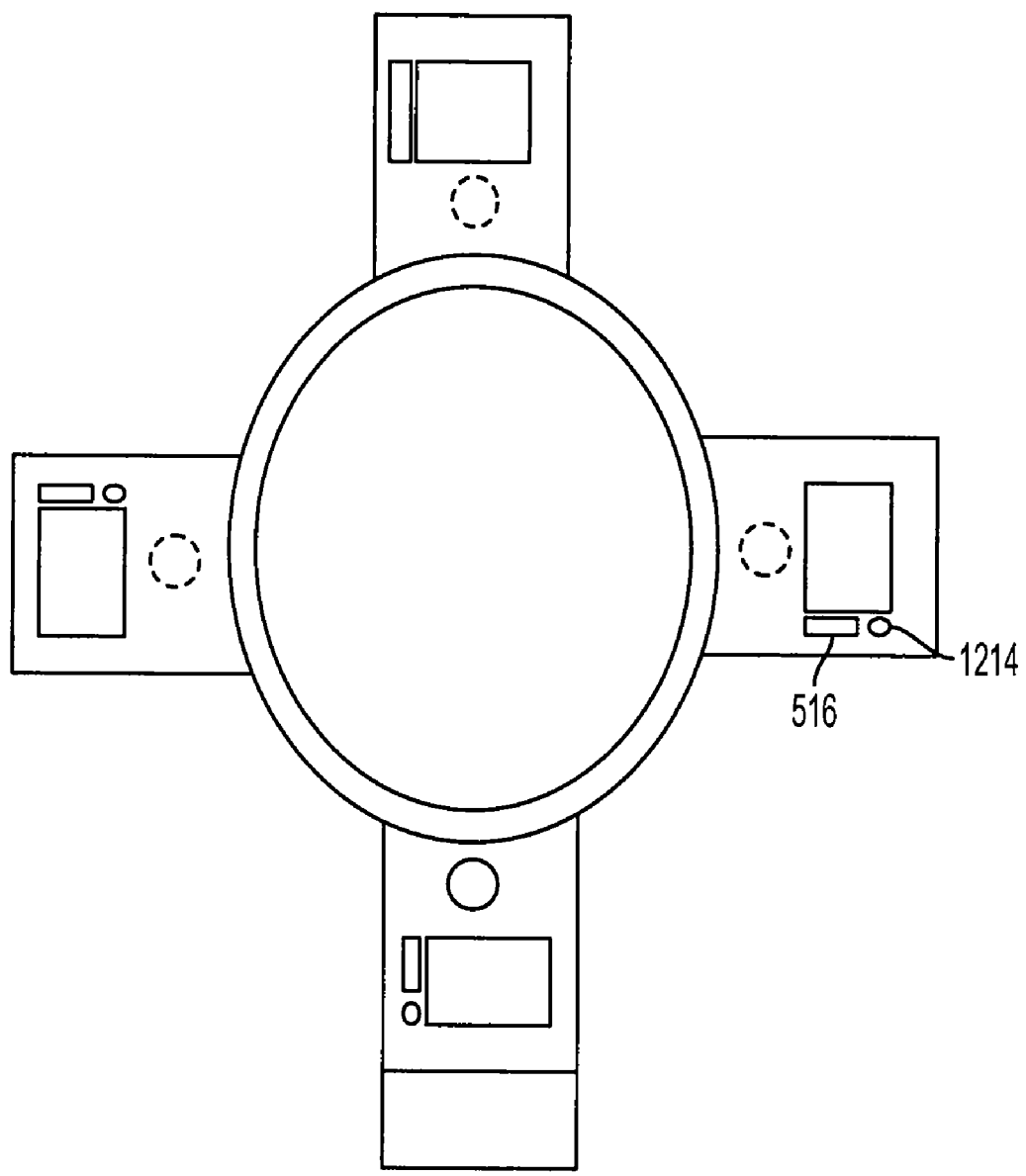
FIG. 12 shows a sensor located in a same plane as a compensation device.
Figure 13:
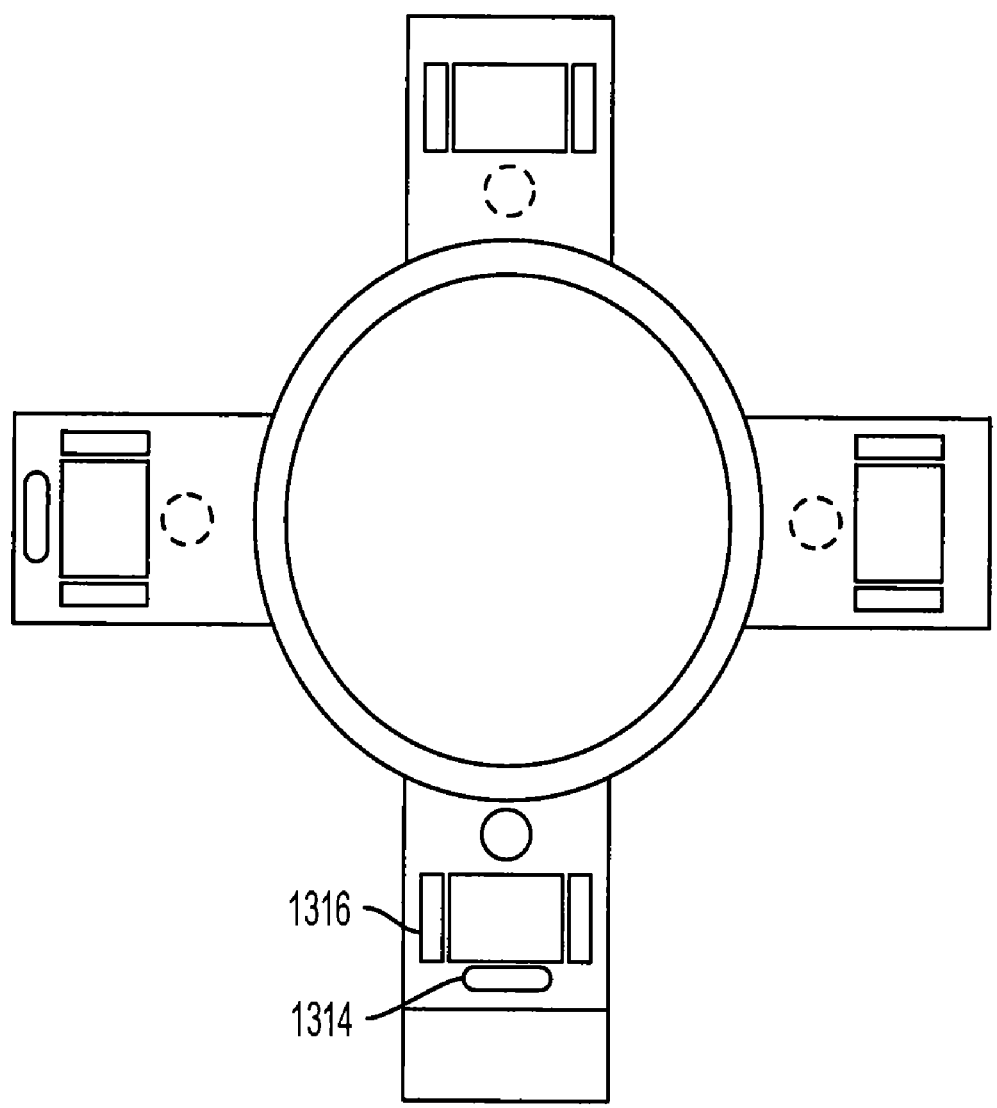
FIG. 13 shows a sensor located in a perpendicular plane to a compensation device.

FIG. 12 shows a sensor 1214 located in a same plane as compensation device 516. Alternatively, FIG. 13 shows a sensor 1314 located in a perpendicular plane to compensation device 516.

Figure 14:
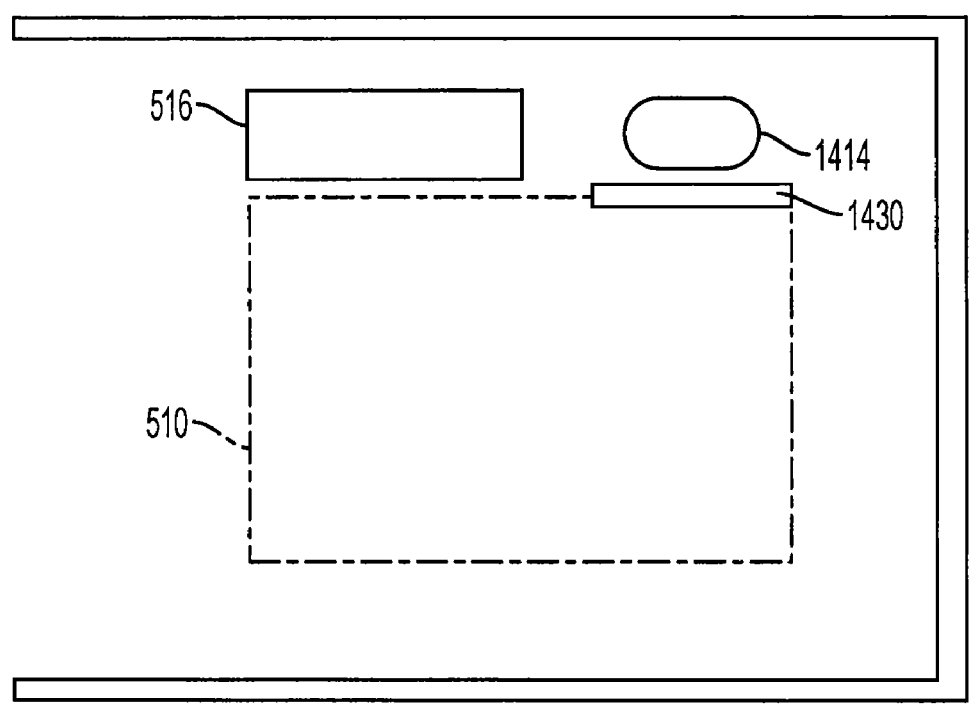
FIG. 14 shows a cap gauge sensor and a reference device used therewith.

FIG. 14 shows a cap gauge sensor 1414 and a reference device or datum 1430. Datum 1430 can be, for example, a ground plane or a Zerodur plated flat reference or a material with substantially no thermal expansion to be used in a measuring operation in conjunction with cap gauge sensor 1414. Also, datum 1430 should be configured to allow for substantially no deformation or bending based on gravity regardless if movement of object 504 is in the horizontal or vertical direction.

Figure 15:
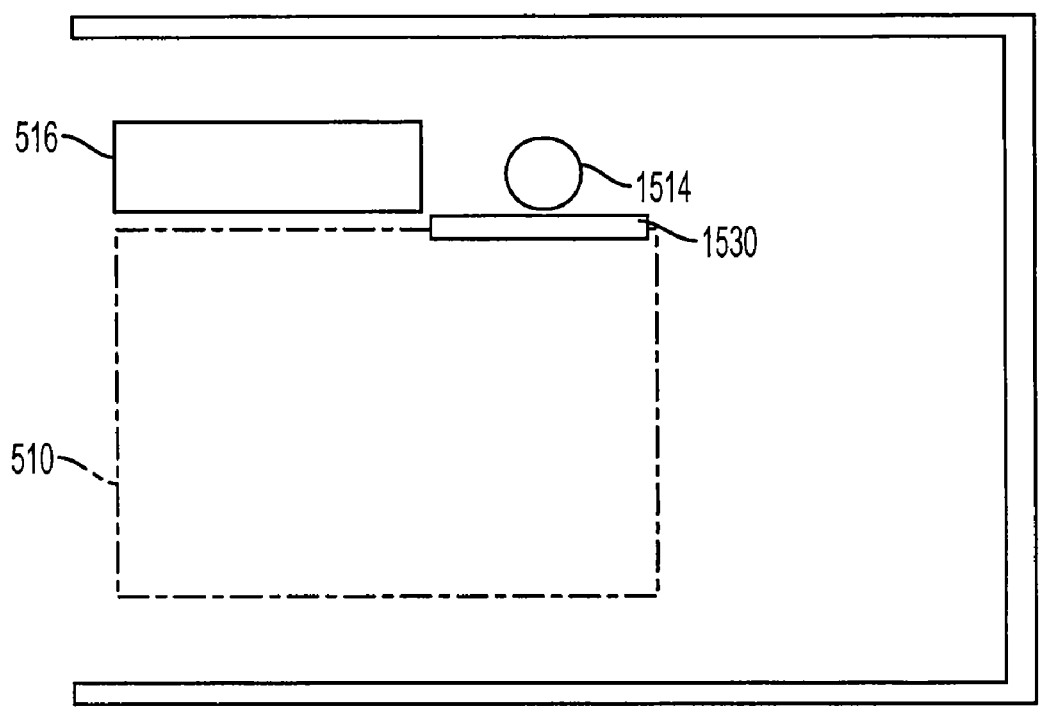
FIG. 15 shows an encoder sensor and a reference device used therewith.

FIG. 15 shows an encoder sensor 1514 and a scale 1530. Scale 1530 can be, for example, a Zerodur plated encoder scale to be used in a measuring operation in conjunction with encoder sensor 1514. This is also described briefly above.

Alternatively, or additionally, reference device 1430 and scale 1530 can be thermally stable and/or rigid surfaces.

Figure 16:
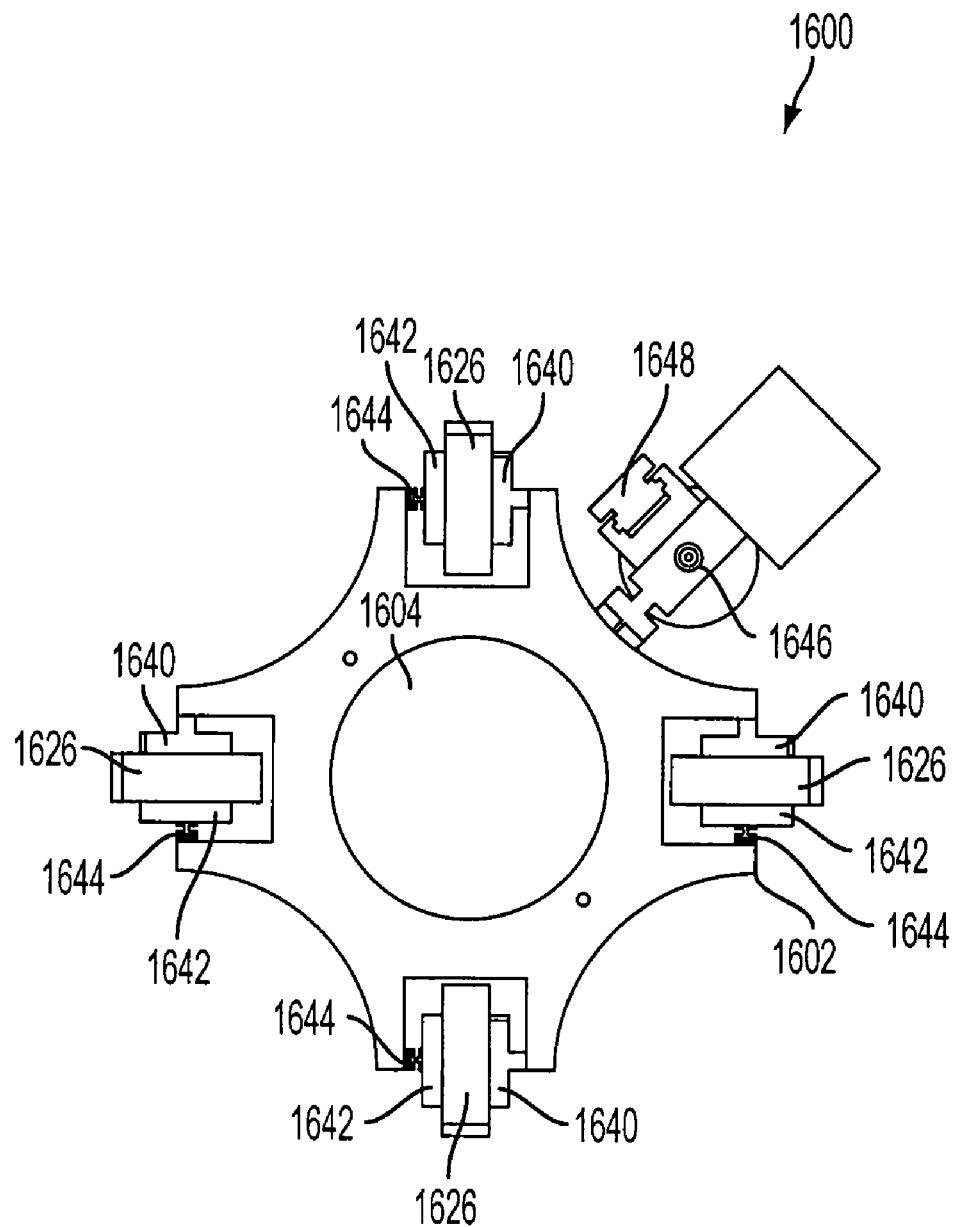
FIGS. 16 and 17 show top and perspective views, respectively, of another system.
Figure 17:
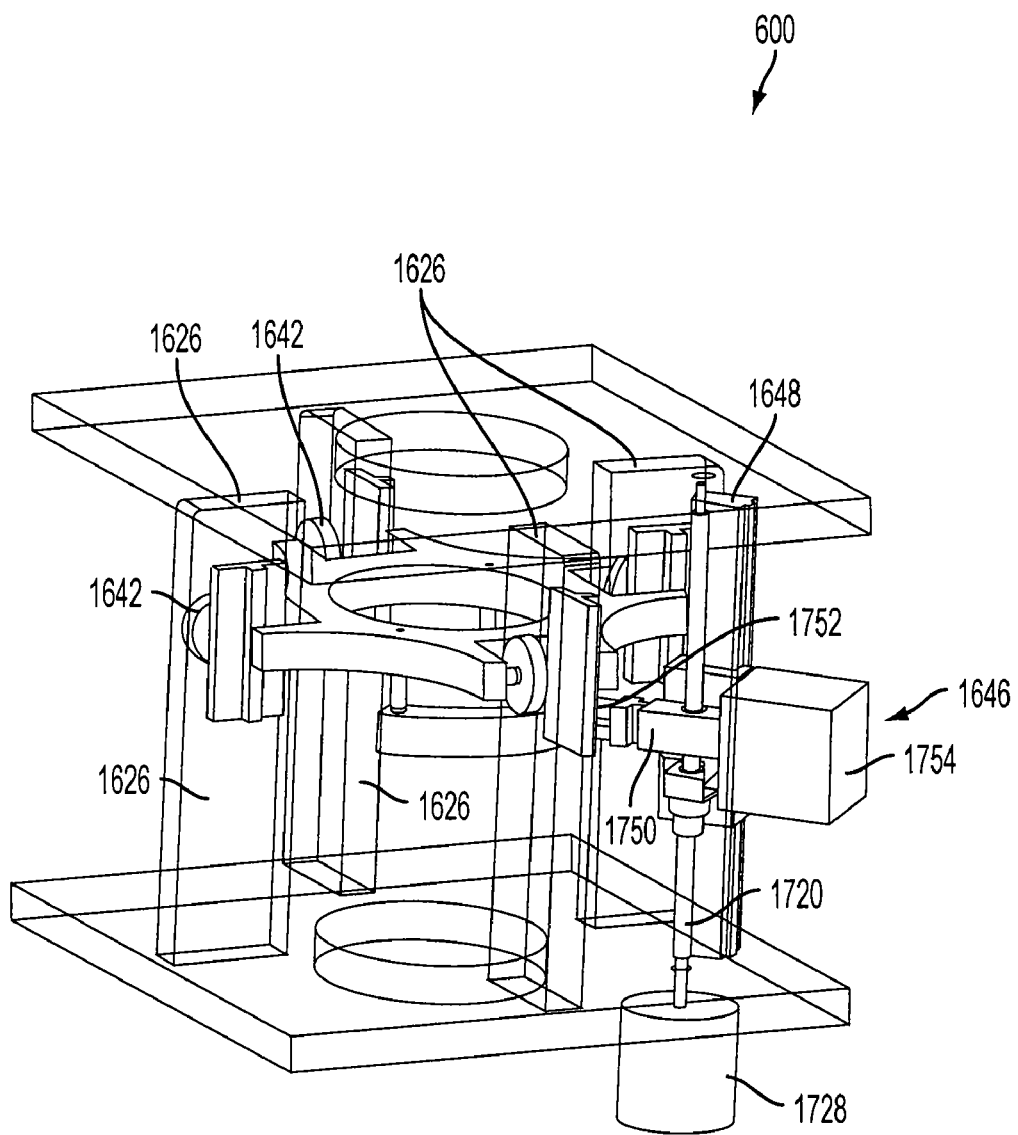

FIG. 16 shows a top view of a system 1600. FIG. 17 shows a perspective view of system 1600. System 1600 includes a support device 1602, an object 1604, guides 1626, fluid bearings 1640 coupled to guides 1626 and support 1602, fluid bearings 1642 that are coupled to support 1602 via springs 1644 and directly to guide 1626. Support 1602 is driven via a motor and screw arrangement 1646 along a drive mechanism guide 1648. The use of respective fluid bearings 1640 and 1642 that are rigidly attached to the moving cell, and another and spring loaded relieves the high tolerance needed for the guide 1648. Using this approach, only one surface of the guide 1648 needs to be polished to optical level tolerance. The flat surface is intended to be shared by a measuring device (not shown), e.g., a cap gauge, a 2-D encoder, etc. used with compensation system (now shown).

Referring now to FIG. 17, in order to apply a force to support 1602 (see FIG. 16) at a center of mass, guide 1648 can consist of a "fork" 1750 connected to support 1602 at two points by flexures 1752. The "drive fork" 1750 is actuated using a screw 1720 driven by a motor 1728. Its motion is balanced using a counterweight 1754 and a ball bearing linear stage (not show).

In addition to solving the de-centering problem, embodiments of the present invention can be used to keep all motors and heat dissipation sources away from optics, e.g., elements 1604. For example, as shown in FIG. 17, screw 1720 can be positioned a desired distance from optics 1604 and connected only by drive-fork 1750. With this arrangement, it is simple to partially enclose the screw drive and purge it by maintaining a lower air pressure in the screw compartment. The purging gas would be supplied naturally by the air bearings.

Additionally, or alternatively, a laser reference, such as an interferometer, can be used to measure the de-centering of the stage and compensate for this effect using an additional set of optics.

Additionally, or alternatively, a static, and not dynamic, adjustment can be made when a non-flatness error of a few microns is allowed for each of the guides. In this example, a mapping, e.g., pre-calibration, can be done for the non-straightness of a surface (or surfaces) of the guide after the guide has been assembled by moving a support along the guide from one end of travel to the other, and sensing the straightness of the surface of the guide during the movement. Correction of the non-straightness error is implemented by varying the gaps a and a' based on the mapping, i.e., the known errors in flatness. Fluid bearings suitable for this application operate well with gaps a and a' in the range of about 5 to 15 microns. Therefore a straightness correction range of about 10 microns is available by varying the inlet pressure of the fluid bearing to position compensation devices anywhere between about 5 and 15 microns from the guide. Varying the inlet pressure can be accomplished, for example by a linear flow control valve using feedback from a gap sensor, as is known in the art.

It is to be appreciated a dynamic and static compensation scheme could be used that combines the pre-calibration or mapping with the continuous detection.

In one example, a rotary fluid or magnetic bearing can be used in place of the linear air bearing described above without departing from the scope of the present invention.

Figure 18:
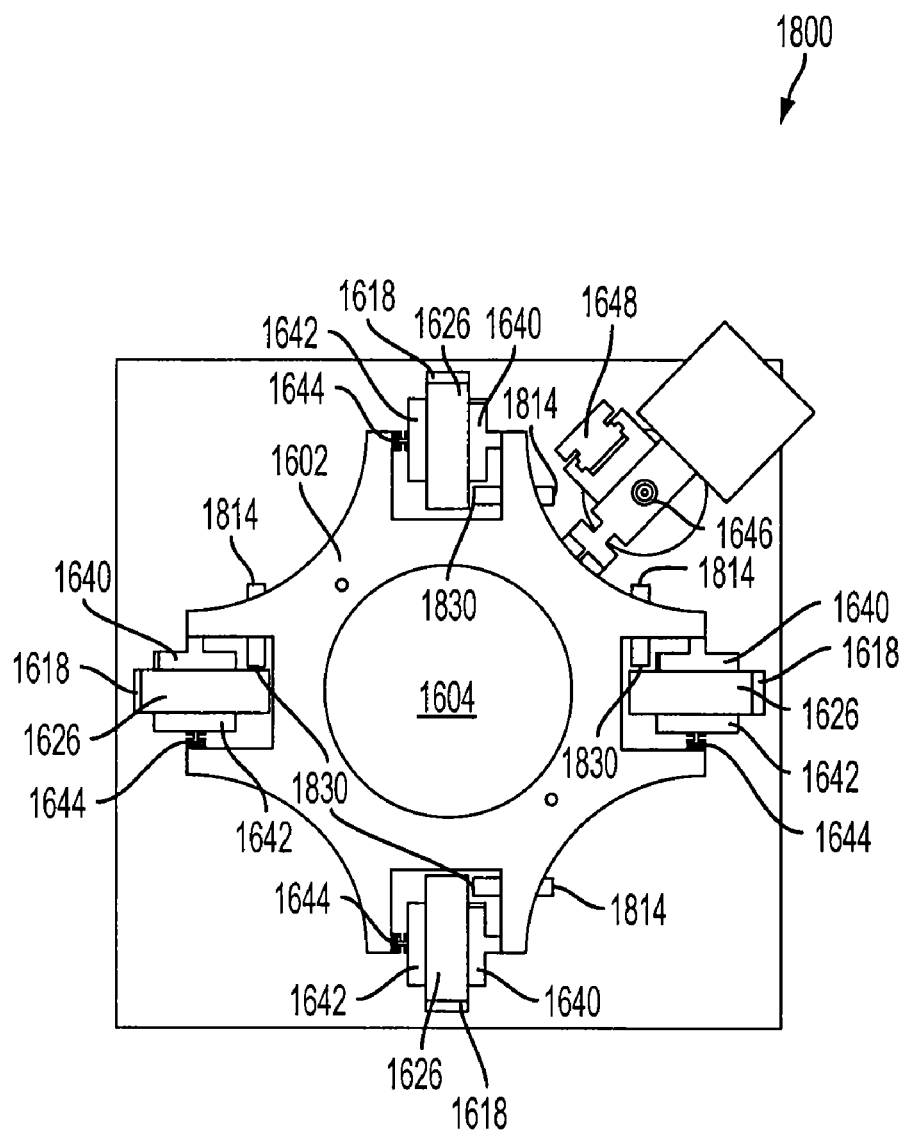
FIGS. 18 and 19 show top views of various systems.

FIG. 18 shows a top view of a system 1800. A main difference between system 1800 and system 1600 is the addition of sensors 1814 and sensed surfaces 1830. For example, elements 1814 and 1830 can be similar to elements 1414 and 1430 in FIG. 14 or surface 730 in FIG. 7 discussed above. An inside surface of element 1626 that includes area 1430 can either be polished steel, or the like, or a strip of Zerodur, or similar material, can be coupled to the surface. In this configuration, sensors 1814 measure a distance to surface 1830. In this perspective, X direction measurement and correction can be performed using the top and bottom sensors 1830 and Y direction measurement and correction can be performed using the right and left sensors 1830. In order to adjust position of object 1604, an increase in pressure on bearing 1640 and decrease in pressure on bearing 1642 is needed, or vice versa based on the measured X and Y positions of the object 1604.

It is to be appreciated that appropriate sensors can be positioned in a sheer configuration to measure a distance from a side of a front surface 1614 having an encoder scale.

Figure 19:
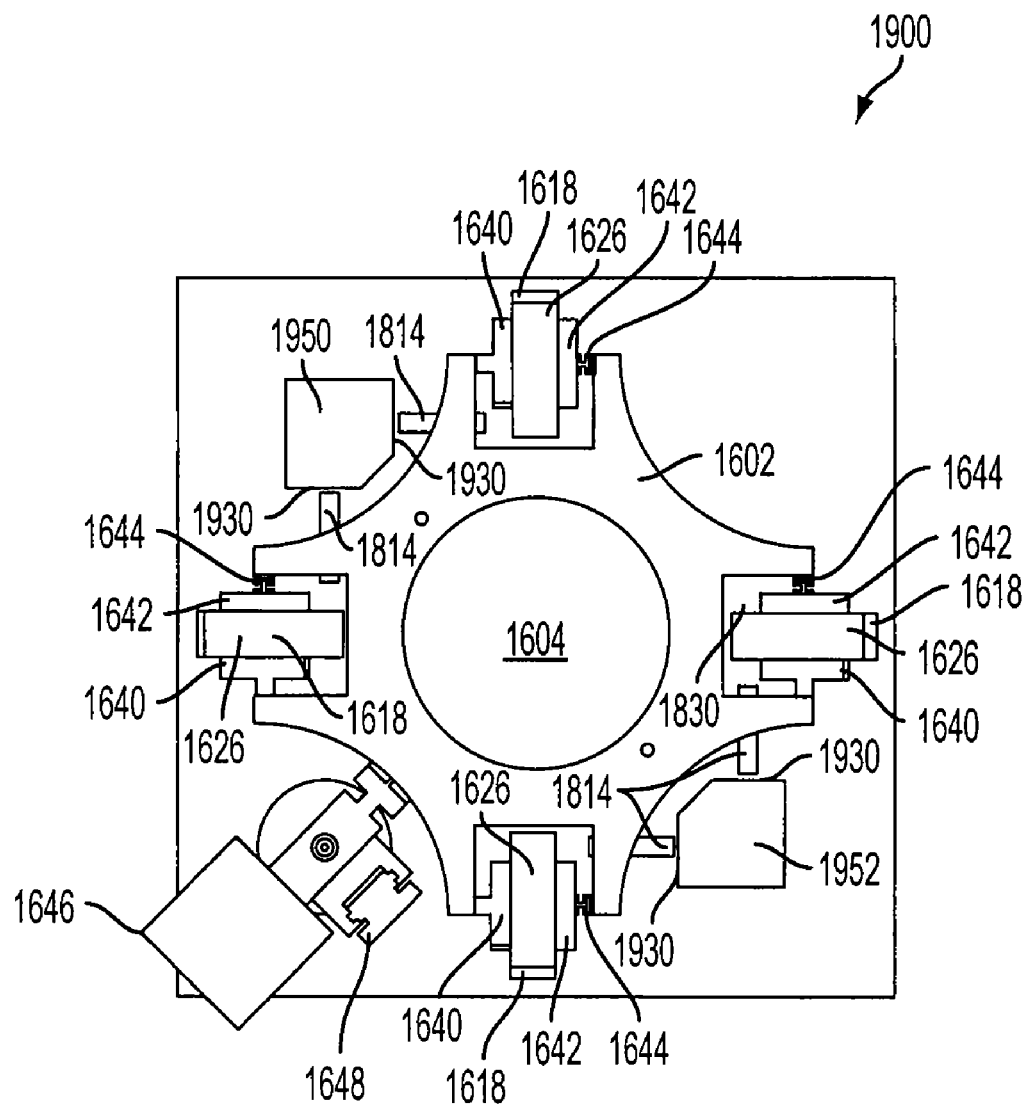

FIG. 19 shows a top view of a system 1900. The main difference between system 1800 and system 1900 is the addition of reference bars 1950 and 1952 in system 1900. System 1900 is designed to allow for effective measurement of position regardless if object 1604 is moved horizontally or vertically. Thus, the influence of sagging or bending associate with gravity when object 1604 is moving horizontally should not effect the position of a measurement surface 1930 of reference bars 1950 and 1952 since they are decoupled from any bearing load of support 1602. Thus, horizontal movement should not effect measurement accuracy. Any sag or bending of reference bars 1950 and 1952 would be constant and known, and thus compensated for during the processing of the measurement signals. In this configuration, sensors 1614 measure the reference surface 1930 of reference bars 1950/1952 to determine proper positioning of object 1604. As discussed above, reference surface 1930 can either be polished steel, polished to a smoothness required for measuring, or include a Zerodur or similar plate coupled thereto. Although shown with two of the reference bars 1950 and 1952, alternatively other numbers of reference bars could also be used.

Figure 20:
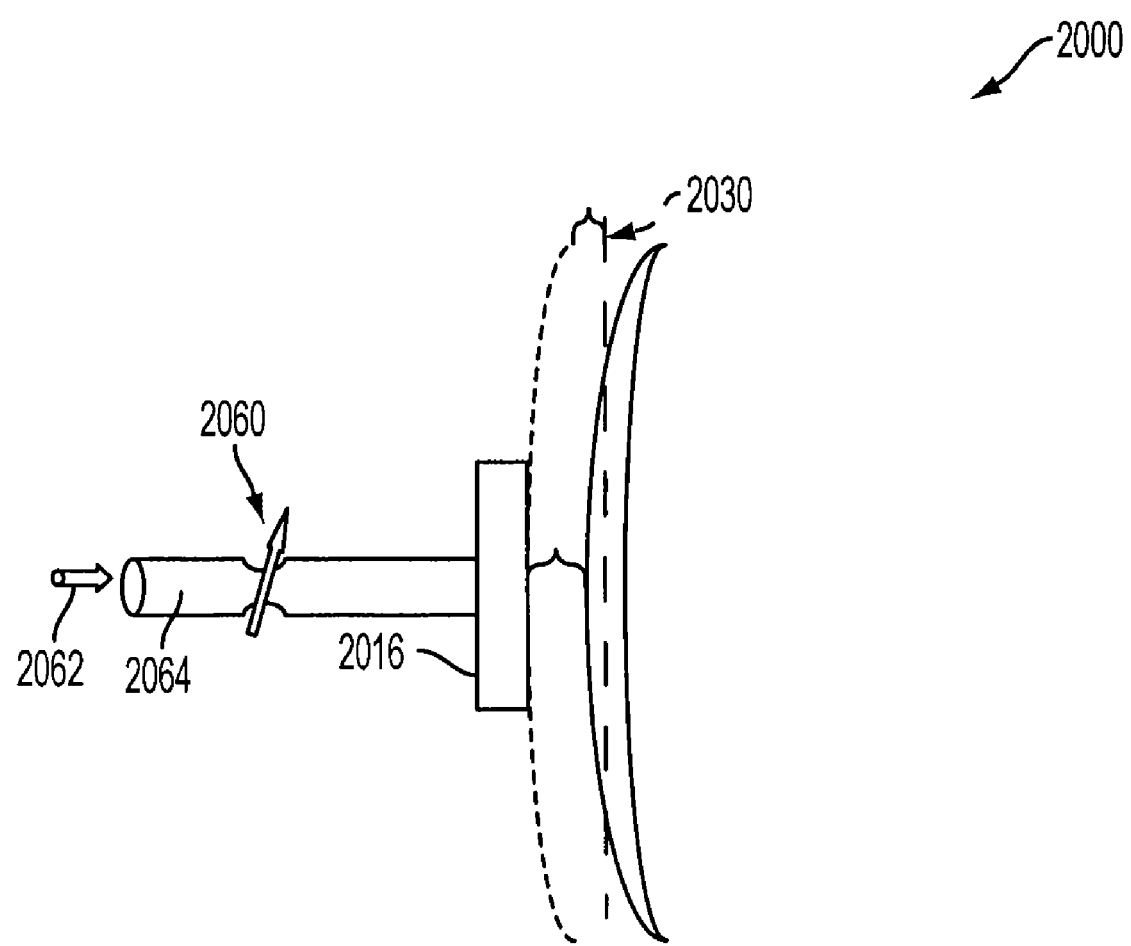
FIGS. 20 and 21 are schematic and block diagrams of a control system.
Figure 21:
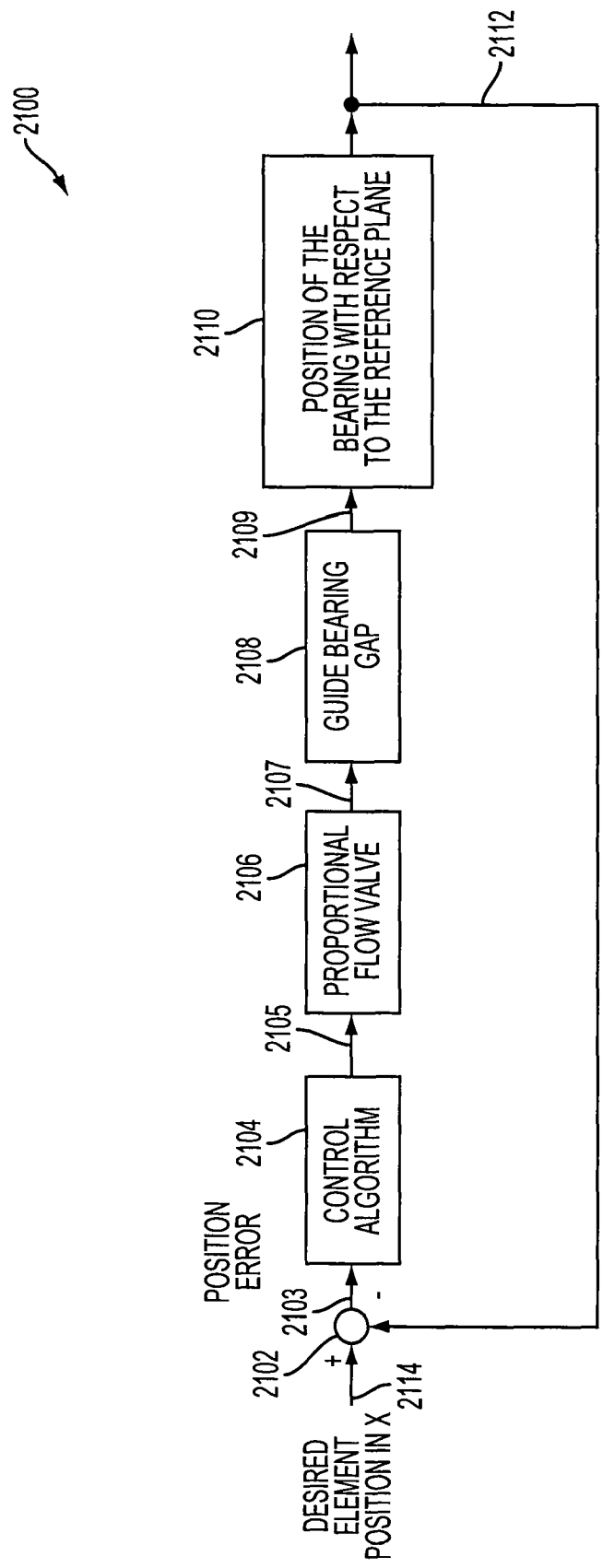

FIGS. 20 and 21 are schematic and block diagrams, respectively, of a control system.

In FIG. 20, a flow valve 2060 controls flow of an air/fluid 2062 through path 2064. The pressure of the air/fluid 2062 is used to adjust a position of an air bearing 2016, as discussed above, A reference plane 2030 is positioned to correlated to a desired air gap a (or a'). The adjustment of air bearing 2016 with respect to reference plane 2030 is performed through controlling flow of air/fluid 2062 using a control system 2100, as discussed in more detail below.

In FIG. 21, a control system 2100 is shown that includes a summer 2102, a controller 2104, a proportional control valve controller 2106, guide bearing gap detector 2108, and a position determining device 2110. Controller 2104 may contain a control algorithm or the like that processes a signal 2103 from summer 2102 and generates a signal 2105 therefrom. Proportional control valve controller 2106 can be used to control a flow valve, e.g., flow valve 2060, that controls a flow of a air or fluid used to adjust a position of an air bearing through a signal 2107. Guide bearing gap detector 2108 determines a current gap between a reference plan and a air bearing based on signal 2107, and outputs a signal 2109 based thereon. Based on signal 2109 from guide bearing gap detector 2108, position determining device 2110 generates a signal 2112 of an actual bearing position that is feed back to summer 2102. This actual bearing position signal 2112 is compared to a desired element position signal 2114 at summer at summer 2102 to generate signal 2103.

Figure 22:
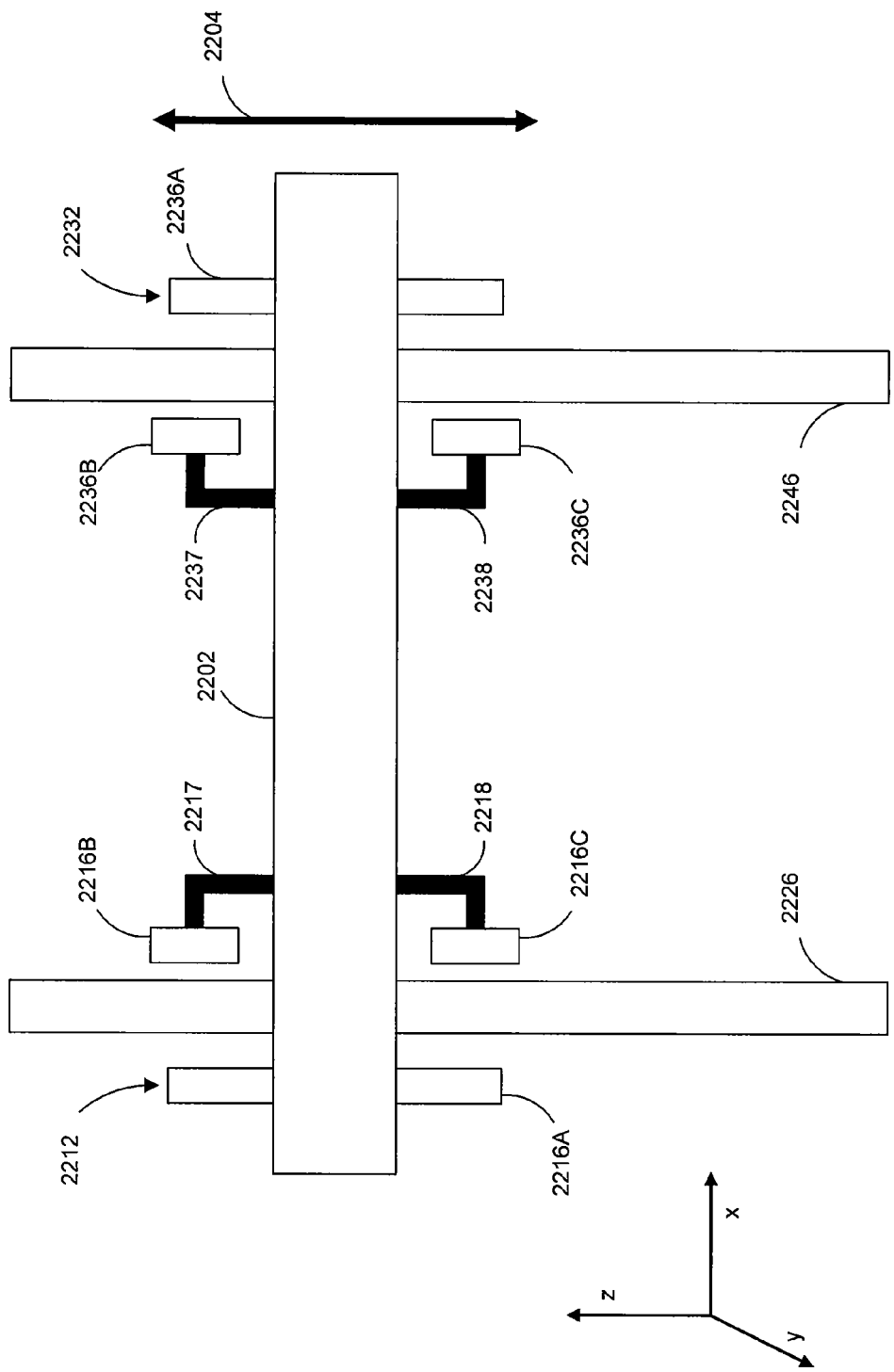
FIG. 22 depicts a portion of the exemplary system of FIG. 7.

FIG. 22 depicts a portion of the exemplary system depicted in FIG. 7. In FIG. 22, a movable support 2202 supports an optical element (not shown). In one embodiment, openings in support 2202 (not shown) may receive guides 2226 and 2246, and a portion of an actuation system, such as screw 620 driven by motor 728 (see FIGS. 6 and 7), may advance support 2202 along guides 2226 and 2246 in a direction of travel indicated by arrow 2204.

In the embodiment of FIG. 22, compensation systems 2212 and 2232 are associated, respectively, with guides 2226 and 2246. Compensation systems 2212 and 2232 may compensate for unwanted motions, variations in the flatness of a surface of the guides, and thermal shifting or distortion of cell 2202 and/or the object or objects supported by support 2202. Further, in contrast to the compensation systems described in FIGS. 5-7, compensation systems 2212 and 2232 are also configured to compensate for any tilting or undesired rotation experienced by support 2202 and/or the object or objects supported by support 2202.

In FIG. 22, compensation systems 2212 and 2232 may include, respectively, a sensor (not shown), such as sensor 514 in FIG. 5, and three air pads, which receive a fluid or air flow from a fluid or air source (not shown) at an inlet, and which subsequently output the fluid or air flow through a porous surface, or a plurality of holes in surfaces, that face guides 2226 and 2246, respectively. In one embodiment, the output from the sensor may be used to independently regulate air pressure to each respective air pad to compensate for the de-centering and tilting of support 2202 and/or the optical elements supported by support 2202 Alternatively, the output from the sensor may independently regulate groups of two or more air pads to compensate for de-centering and tilting. One skilled in the art would recognize that a variety of configurations of air pads, controlled independently and/or in groups, may compensate for de-centering and tilting of support 2202 without departing from the spirit or scope of the present invention.

Further, in an additional embodiment, at least one air pad may be mounted to support 2202 using a rigid connection, and at least one air pad may be mounted to support 2202 using a flexural connection, including, but not limited to, a spring. The use of flexibly-mounted air pads may substantially reduce a level of stress-related deformation experienced within system 2200.

In FIG. 22, compensation device 2212 includes a first air pad 2216A, which is mounted to support 2202 using a flexural connector (not shown). Further, compensation device 2212 also includes second and third air pads 2216B and 2216C that are mounted, respectively, to support 2202 using rigid connectors 2217 and 2218. Second and third air pads 2216B and 2216C are disposed, respectively, on a side of guide 2226 opposite that of first air pad 2216A.

Similarly, compensation device 2232 includes a first air pad 2236A that is be mounted to support 2202 using a flexural connector (not shown). Further, compensation device 2232 includes second and third air pads 2236B and 2236C that are mounted, respectively, to support 2202 using rigid connectors 2237 and 2238. Second air pad 2236B and third air pad 2236C are disposed, respectively, on a side of guide 2246 opposite that of first air pad 2236A.

In one embodiment, support 2202 may be centered by varying a size of the air gaps between guide 2226 and air pads 2216A, 2216B, and 2216C, and further, by varying a size of the air gaps between guide 2246 and air pads 2236A, 2236B, and 2236C. These respective air gaps may be on the order of about five to ten microns. As described above with reference to FIGS. 5-7, the sensor may measure the position of the support relative to a datum (not shown), such as datum 730 of FIG. 7, and the air pressure output from the respective air pads may be individually and/or independently adjusted on the basis of the measurement to maintain the alignment of the optical elements supported by support 2202.

Further, as described above with reference to FIG. 7, support 2202 often tilts while advancing along guides 2226 and 2246. In order to minimize the induced tilting, a counterweight is applied to one or more supports in FIGS. 5-7 in order to move the center of gravity of each respective support towards the location of the portion of the actuation system that drives each respective support.

In contrast to the system of FIGS. 5-7, sensors associated with respective compensation systems 2212 and 2232 measure any tilting or rotation of support 2202 relative to the datum and adaptively compensate for any tilting or rotation of support 2202. In one embodiment, based on the measured tilting of support 2202, an air pressure output of air pad 2236B is different from that of air pad 2216B. Therefore, the gap between air pad 2236B and guide 2246 also differs from that between air pad 2216B and guide 2226, and the disparity in air pressure output generates a rotational motion that compensates for the measured tilting of support 2202. Further, a disparity between the air pressure output of air bearing pads 2236C and 2216C may result in a similar variation of the gap between air bearing pad 2236B and guide 2246, and between air bearing pad 2216B and guide 2226, thus generating a rotational motion further compensates for the measured tilting of support 2202.

Compensation systems 2212 and 2232 have been described in terms of a support 2202 moves vertically along guides 2226 and 2246. However, the present invention is not limited to such embodiment. In an additional embodiment, the compensation systems of FIG. 22 may correct the centering and/or the tilting of a support 2202 that travels horizontally along guides 2226 and 2246, or alternatively, that travels along guides 2226 and 2246 at any angle that would be apparent to one skilled in the relevant art.

In one embodiment, compensation systems 2212 and 2232 may measure and compensate for the tilting of support 2202 in the x-z plane, as depicted in FIG. 22. However, the present invention is not limited to such embodiments. In additional embodiments, compensation systems 2212 and 2232 may measure and compensate for the tilting of support 2202 in the x-y plane, or along any additional plane apparent to one skilled in the art, without departing from the spirit or scope of the present invention.

Figure 23:
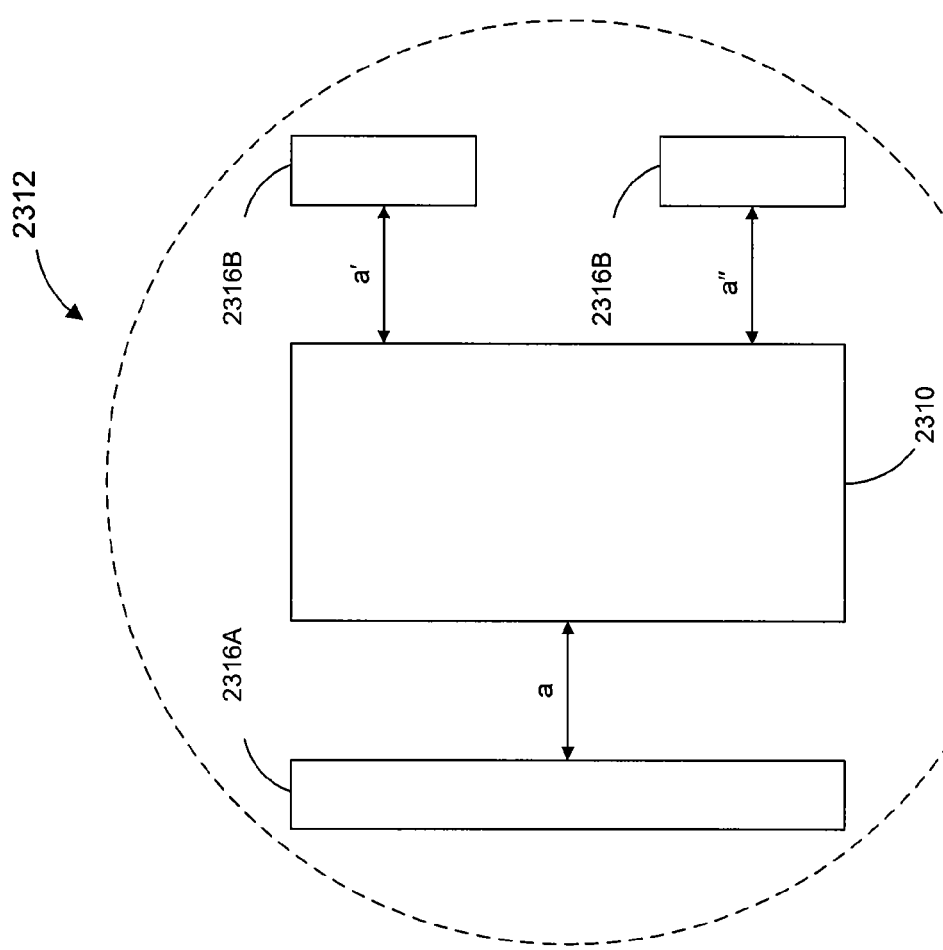
FIG. 23 depicts a compensation system that may be incorporated into the exemplary system of FIGS. 5 and 6.

FIG. 23 depicts a compensation system 2312 that may be incorporated into the exemplary system of FIGS. 5 and 6. Similar to compensation system 512 in FIG. 5, compensation system 2312 may compensate for unwanted motions, variations in the flatness of a surface of the guide, and thermal shifting or distortion of a support and/or object caused by temperature fluctuations. Further, in contrast the compensation system of FIGS. 5-7, compensation system 2312 also measures and compensates for any tilting or rotation induced during the movement of the support and/or the object supported by the support.

In one embodiment, compensation system 2312 includes a sensor (not shown), such as sensor 514 in FIG. 5, and compensation devices 2316A, 2316B, and 2316C. For example, respective compensation devices 2316A, 2316B, and 2316C receive a fluid or air flow from a fluid or air source (not shown) at an inlet. Compensation devices 2316A, 2316B, and 2316C then respectively output the fluid or air flow through a porous surface, or a plurality of holes in a surface, that face opening 2310 to apply a pressure to an element passing through an opening 2310, such as element 726 in FIG. 7.

Air gap a exists between compensation device 2316A and opening 2310, and air gaps a' and a" exist between opening 2310 and compensation devices 2316B and 2316C, respectively. In one embodiment, the fluid flow from respective compensation devices applies pressure to the element passing through opening 2310 such that air gap a' is equivalent to a", and further, such that the value of a+a' (and a+a') remains constant. Thus, as a increases in size, a' and a" both decrease in size. In an additional embodiment, the fluid flow from respective compensation devices applies pressure to the element passing through opening 2310 such that air gap a', which separates compensation device 2316B from opening 2310, varies in size from air gap a", which separates compensation device 2316C from opening 2310.

Compensation system 2312 may be incorporated into a system having a multiple layer arrangement, such as system 700 depicted above in FIG. 7. In such an arrangement, compensation system 2312 may be configured to compensate for any non-straight surfaces of guides, such as guides 726 in FIG. 7, or shifting (e.g., thermal shifting) of the support devices, such as support devices 502 of FIG. 7. By moving the support devices with respect to (e.g., traverse to) the guides during movement of the support devices along the guides, compensation system 2312 may compensate for the non-straight surfaces, this centering the support devices and the optical elements supported by these devices.

In one embodiment, optical elements in the multiple layer arrangement may be centered by first holding air gaps a' and a" constant, and by subsequently varying one or both of the air gaps a and a' (and a'). For example, air gaps a, a', and a" can be on the order of about five to ten microns, and in operation, air gaps a and a' may be adjusted based on measurements of position relative to a datum (not shown), such as datum 730 of FIG. 7. As such, the air pressure output from respective compensation devices 2316A, 2316B, and 2316C is individually and/or independently adjusted in order to center optical elements within the multiple layer arrangement.

In an additional embodiment, compensation system 2312 may be incorporated into the multiple layer arrangement to measure any tilting or rotation of the support and to compensate directly for any induced tilting or rotation. In one embodiment, the sensor measures the tilting or rotation of the support relative to the datum. Compensation system 2312 then corrects for tilting effects in the multiple layer arrangement by adjusting air gaps a, a', and a" such that the magnitude of gap a' differs from the magnitude of gap a". As such, the air pressure output from respective compensation devices 2316A, 2316B, and 2316C is individually and/or independently adjusted to generate a corresponding rotational motion that corrects for the measured tilting of optical elements.

Therefore, respective compensation devices 2316A, 2316B, and 2316C, may be dynamically adjusted based on measurements obtained relative to a single datum to maintain alignment of optical elements and to compensate for tilting in the multiple layer arrangement of FIG. 7. Further, in additional embodiments, such automatic adjustment may reduce or eliminate the application of counterweights to the one or more supports within the multiple layer arrangement.

Although described in terms of air or fluid bearings, the compensation systems described in FIGS. 22 and 23 are not limited to such embodiments. The compensation systems described with respect to FIGS. 22 and 23 may accommodate a variety of fluid and magnetic bearings in which a gap can be varied without departing from the scope of this invention.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system, comprising:
    one or more support devices having one or more openings;
    a guide passing through respective ones of the one or more openings;
    fluid or magnetic bearings configured to guide the one or more support devices along the guide; and
    a compensation system coupled to respective ones of the one or more support devices adjacent to each of the fluid or magnetic bearings, the compensation system configured to generate a rotational motion that compensates for tilt in the one or more support devices or to compensate for non-straight areas of the guide or shifting of the one or more support devices, wherein the compensation system comprises a sensor configured to determine at least one of position or tilting of the respective support device based on a measurement using a datum surface of the guide.

2. The system of claim 1, wherein:
    the one or more support devices support optical elements, and
    the compensation system is configured to move the one or more support devices such that center axes of the optical elements are aligned.

3. The system of claim 1, wherein the compensation system comprises:
    a compensation device that is configured to output a fluid flow toward the surface of the guide to adjust a position of or apply a rotational motion to the support device with respect to the guide based on a signal from the sensor.

4. The system of claim 3, wherein the compensation device is positioned on one side of the guide.

5. The system of claim 3, wherein the compensation device includes first and second compensation devices positioned on opposite sides of the guide.

6. The system of claim 1, wherein the sensor comprises a proximity sensor.

7. The system of claim 1, wherein the sensor comprises a cap gauge sensor.

8. The system of claim 1, wherein the sensor comprises an encoder.

9. The system of claim 1, wherein the sensor comprises an optical sensor.

10. The system of claim 1, wherein the sensor is positioned in a same plane as the fluid or magnetic bearings.

11. The system of claim 1, wherein the sensor is positioned in a perpendicular plane with respect to a plane of the fluid or magnetic bearings.

12. The system of claim 1, wherein:
    at least one of the one or more support devices is configured to support an optical element; and
    the sensor is configured to detect optical characteristics of the optical element.

13. The system of claim 1, wherein:
    a gap between the guide and the compensation system is about five to ten microns; and
    the compensation device is configured to maintain a constant size of the gap during movement of the respective support device along the guide.

14. The system of claim 1, wherein the fluid bearing is a linear fluid or air bearing.

15. The system of claim 1, wherein the fluid bearing is a rotary fluid or air bearing.

16. The system of claim 1, wherein the guide has a circular, rectangular, square, or triangular cross sectional shape.

17. The system of claim 1, wherein the fluid bearing is a compressed air bearing, an air bearing, or a hydraulic bearing.

18. The system of claim 1, further comprising an actuating system configured to move the one or more support devices and wherein:
    first through third ones of the support devices support respective first through third lenses of a zoom system;
    the actuating system is coupled to respective ones of the first through third ones of the support devices; and
    the compensation system is configured to individually move each of the support devices such that center axes of the lenses remain aligned during a zoom operation.

19. The system of claim 18, wherein the actuating system comprises:
    a motor; and
    a screw coupled to the motor and to respective ones of the support devices, such that as the screw rotates, the respect ones of the support devices move in one of two directions along the guide.

20. The system of claim 1, wherein each of the support devices includes or is coupled to a counter weight device.

21. The system of claim 1, wherein the compensation system is configured to detect and compensate for thermal shifting of the one or more support devices.

22. The system of claim 1, wherein the one or more support devices, guide, fluid or magnetic bearings, and compensation system form part of an illumination system configured to condition a beam of radiation.

23. An illumination system of a lithography apparatus, comprising:
    one or more support devices having one or more openings;
    a guide passing through respective ones of the one or more openings;
    fluid or magnetic bearings configured to guide the one or more support devices along the guide; and
    a compensation system coupled to respective ones of the one or more support devices adjacent to each of the fluid or magnetic bearings, the compensation system configured to generate a rotational motion that compensates for tilt in the one or more support devices or to compensate for non-straight areas of the guide or shifting of the one or more support devices, wherein the compensation system comprises a sensor configured to determine at least one of position or tilting of the respective support device based on a measurement using a datum surface of the guide.

24. A lithography apparatus, comprising:
    an illumination system configured to produce a beam of radiation;
    a patterning device configured to pattern the beam of radiation; and
    a projection system configured to project the patterned beam onto a target portion of a substrate, wherein the illumination system comprises:

one or more support devices having one or more openings;

a guide passing through respective ones of the one or more openings;

fluid or magnetic bearings configured to guide the one or more support devices along the guide; and a compensation system coupled to respective ones of the one or more support devices adjacent to each of the fluid or magnetic bearings, the compensation system configured to generate a rotational motion that compensates for a tilt in the one or more support devices or to compensate for non-straight areas of the guide or shifting of the one or more support devices, which is done through moving of the one or more support devices traverse to the guide, during movement of the one or more support devices along the guide.

25. The system of claim 1, wherein the compensation device comprises a first compensation device positioned on one side of the guide, and a second compensation device and a third compensation device positioned on an opposite side of the guide.

26. The system of claim 25, wherein:

a gap between the guide and each of the first, second, and third compensation devices is about five to ten microns; and the first, second, and third compensation devices are configured to maintain a constant gap during movement of the respective support device along the guide.

27. The system of claim 25, wherein:

a gap between the guide and each of the first, second, and third compensation devices is about five to ten microns; and the gap between the guide and the first compensation device is different from at least one of the gap between the guide and the second compensation device or the gap between the guide and the third compensation device.

28. The system of claim 25, wherein:

a fluid flow output by the second compensation device is equivalent to a fluid flow output by the third compensation device.

29. The system of claim 25, wherein:

a fluid flow output by the second compensation device is different from a fluid flow output by the third compensation device.

30. The system of claim 1, wherein:

at least one of the one or more support devices supports an optical element;

the sensor is configured to detect optical characteristics of the optical element; and the compensation device is configured to rotate the one or more support devices, such that center axes of the optical elements are aligned.

* * * * *